(12) United States Patent
Ishii

(10) Patent No.: US 7,910,926 B2
(45) Date of Patent: Mar. 22, 2011

(54) ELECTRO-OPTICAL DEVICE AND ELECTRONIC APPARATUS

(75) Inventor: Tatsuya Ishii, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 239 days.

(21) Appl. No.: 12/142,527

(22) Filed: Jun. 19, 2008

(65) Prior Publication Data

US 2009/0057669 A1 Mar. 5, 2009

(30) Foreign Application Priority Data

Aug. 28, 2007 (JP) ................. 2007-220686

(51) Int. Cl.
*H01L 27/02* (2006.01)
(52) U.S. Cl. ............... 257/59; 257/57; 257/72; 257/83; 257/217; 257/290; 438/30; 438/48; 438/128; 438/149; 438/151; 349/46; 349/47
(58) Field of Classification Search .............. 257/59, 257/57, 72, 83, 217, 290; 438/30; 349/46, 349/47
See application file for complete search history.

(56) References Cited

U.S. PATENT DOCUMENTS

| | | | | |
|---|---|---|---|---|
| 6,864,505 B2 * | 3/2005 | Yamasaki | .................. | 257/59 |
| 7,427,777 B2 * | 9/2008 | Tsou et al. | .................. | 257/59 |
| 2007/0117239 A1* | 5/2007 | Ishi | .......................... | 438/30 |

FOREIGN PATENT DOCUMENTS

| | | | |
|---|---|---|---|
| JP | 2001-356709 | * | 12/2001 |
| JP | 2003-262888 | | 9/2003 |
| JP | 2004-4722 | | 1/2004 |
| JP | 3731447 | | 1/2006 |
| JP | 2008-26719 | | 2/2008 |

* cited by examiner

*Primary Examiner* — Benjamin P Sandvik
*Assistant Examiner* — Farid Khan
(74) *Attorney, Agent, or Firm* — AdvantEdge Law Group, LLC

(57) ABSTRACT

An electro-optical device includes a switching element with a gate electrode provided opposite to the channel region. The gate electrode has a ring-shaped structure that surrounds a junction region between the channel region and a source/drain region.

10 Claims, 12 Drawing Sheets

ELECTRO-OPTICAL DEVICE AND ELECTRONIC APPARATUS

BACKGROUND

1. Technical Field

The present invention relates to an electro-optical device such as a liquid crystal device or the like. In addition, the invention further relates to an electronic apparatus that is provided with an electro-optical device. An example of a variety of electronic apparatuses to which the invention can be applied includes but not limited to a liquid crystal projector.

2. Related Art

A liquid crystal device, which is an example of an electro-optical device, is widely used not only as a direct-view-type display device but also, for example, optical modulation means, such as a light valve, of a projection-type display device. In particular, when employed as a projection-type display device, an intense light beam coming from a light source tends to enter into a liquid crystal light valve. In order to prevent such an intense light beam from causing an increase in a leakage current at a thin film transistor (TFT) provided in the liquid crystal light valve and/or any malfunction of the TFT, the liquid crystal light valve has a built-in light-shielding film which functions as light-shutting means for shutting any incident light off. Regarding such light-shielding means or a light-shielding film, as an example of published documents, JP-A-2004-4722 discloses a technique for shutting light off by means of scanning lines each of which functions as a gate electrode in the channel region of a TFT. Japanese Patent No. 3,731,447 discloses a technique in which an amount of light that reaches the channel region of a TFT is reduced by means of a plurality of light-shielding films deposited on the channel region and a light absorption layer that absorbs an inner reflected light. JP-A-2003-262888 discloses a technique that makes it possible to ensure the appropriate operation of TFTs and to narrow scanning lines, and further to reduce the amount of an incident light beam that enters the channel region of a TFT as small as possible.

When such a light-shielding film as one described above is used to shut light off to protect a TFT, however, the light-shielding film is deposited not in direct contact with a semiconductor layer that constitutes a TFT but separately therefrom in such a manner that some other layer, for example, an insulator film, is interposed therebetween when viewed in three dimensions. According to such a configuration, there is a risk that an incident light beam entering inside at an oblique angle to bypass the light-shielding film reaches the semiconductor layer that constitutes the TFT, thereby causing the generation of a light leakage current in the TFT. Due to the generation of light leakage currents in TFTs as described above, there could occur a technical problem of the generation of a flicker noise, nonuniformity among pixels, and so on, which results in degradation in the quality of a displayed image.

SUMMARY

An advantage of some aspects of the invention is to provide an electro-optical device such as a liquid crystal device that is driven in an active matrix format, where the electro-optical device to which the invention is directed is capable of reducing the generation of any light leakage current in a pixel-switching element such as a TFT, thereby providing an image display having an excellent quality. In addition, the invention further provides, as an advantage of some aspects thereof, an electronic apparatus that is provided with such an electro-optical device.

In order to address the above-identified problem without any limitation thereto, the invention provides, as a first aspect thereof, an electro-optical device that includes: at least a pair of substrates; a plurality of data lines and a plurality of scanning lines that extend so as to intersect each other, the plurality of data lines and the plurality of scanning lines being formed over the substrate, the data lines being made of, or including, an electro-conductive film having light-shielding property, the scanning lines being also made of, or including, an electro-conductive film having light-shielding property; a plurality of pixel electrodes each of which is formed in a pixel over the substrate at a position corresponding to an intersection formed by the data line and the scanning line; and a plurality of switching elements that is formed over the substrate, each of the plurality of switching elements being formed in a pixel, each of the plurality of switching elements including a semiconductor layer and a gate electrode, the semiconductor layer of the switching element having a channel region that has a channel length along the extending direction of either the data line or the scanning line, a data-line-side source/drain region that is electrically connected to the data line, a pixel-electrode-side source/drain region that is electrically connected to the pixel electrode, a first junction region that is formed between the channel region and the data-line-side source/drain region, and a second junction region that is formed between the channel region and the pixel-electrode-side source/drain region, the gate electrode of the switching element having the shape and/or the structure of a ring that is formed in such a manner that the ring-shaped and/or ring-structured gate electrode surrounds the second junction region of the semiconductor layer thereof in a plan view over the substrate, the gate electrode of the switching element being provided opposite to the channel region of the semiconductor layer thereof with a gate insulation film being interposed between the gate electrode of the switching element and the channel region of the semiconductor layer thereof, wherein at least a part of the second junction region of the semiconductor layer thereof is formed in a cross region at which the data line and the scanning line intersect each other in a plan view over the substrate.

In the configuration of an electro-optical device according to the first aspect of the invention described above, at the time of the operation thereof, a scanning signal is supplied through a scanning line while the supply of an image signal through a data line to a pixel electrode is being controlled, thereby making it possible to perform image display conforming to a so-called active matrix scheme. An image signal is supplied from the data line to the pixel electrode via a transistor at a predetermined timing as the transistor is turned ON/OFF in accordance with a scanning signal that is supplied thereto through the scanning line. The transistor serves as a switching element that is electrically connected between the data line and the pixel electrode. The pixel electrode is a transparent electrode that is made of a transparent conductive material such as ITO (Indium Tin Oxide), though not limited thereto. A plurality of pixel electrodes is provided in a matrix array pattern in a region that functions as a display area over the substrate. Each of the pixel electrodes is formed at a position that corresponds to an intersection formed by the data line and the scanning line.

The above-described transistor, which is a non-limiting example of a variety of switching elements, is made up of a semiconductor layer, a gate electrode, and a gate insulation film. The semiconductor layer of the transistor has a channel region that has a channel length along the extending direction of either the data line or the scanning line, a data-line-side source/drain region that is electrically connected to the data line, a pixel-electrode-side source/drain region that is electrically connected to the pixel electrode, a first junction region that is formed between the channel region and the data-line-side source/drain region, and a second junction region that is formed between the channel region and the pixel-electrode-side source/drain region. The gate electrode of the transistor overlaps the channel region of the semiconductor layer thereof. The gate insulation film is formed between the semiconductor layer and the gate electrode. The switching element may be embodied as a double-gate type thin film transistor. For example, a pair of gate electrodes, that is, an upper gate electrode and a lower gate electrode, may be provided opposite to each other with a semiconductor layer being sandwiched therebetween. Or, as another non-limiting example thereof, each of two gate electrodes may be provided for the corresponding one of two channel regions.

In such a configuration, the above-mentioned two channel regions are connected in series. As still another non-limiting modification example thereof, three or more gate electrodes may be provided.

In the configuration of an electro-optical device according to the first aspect of the invention described above, the gate electrode of the switching element has the shape of a ring and/or the structure thereof that is formed in such a manner that the ring-shaped and/or ring-structured gate electrode surrounds the second junction region of the semiconductor layer thereof in a plan view over the substrate. In addition, in the configuration of an electro-optical device according to the first aspect of the invention described above, the gate electrode of the switching element is provided opposite to the channel region of the semiconductor layer thereof with a gate insulation film being interposed between the gate electrode of the switching element and the channel region of the semiconductor layer thereof. In the description of this specification and the recitation of appended claims, the terms "shape (and/or structure) of a ring" and "ring-shaped (and/or ring-structured)" should be interpreted in a broad concept. Unlike its ordinary and customary meaning, a "ring" is in no case limited to circular one. The "ring" shape of the gate electrode may be a polygon having three or more sides/angles such as a quadrangle, though not limited thereto. The shape of the gate electrode is not limited to a polygonal ring but may be a circular ring or an elliptical ring, though not limited thereto. Or, as another non-limiting example thereof, the ring may be formed as a combination or modification of any of those enumerated above. The ring shape of the gate electrode can be defined as a wide variety of endless shapes that surrounds and/or encloses the second junction region of the semiconductor layer of the switching element. Specifically, the ring shape of the gate electrode surrounds and/or encloses the contour/periphery of the second junction region of the semiconductor layer of the switching element as viewed in the direction of a normal line to the surface of the substrate in such a manner that the second junction region thereof is exposed in the center open area of the ring-shaped gate electrode. As another non-limiting modification example thereof, the ring shape of the gate electrode may have one or more notch formed at a region(s) where it overlaps the data line and/or the scanning line in a plan view as long as such one or more notch does not impair the light-shielding performance thereof.

In a plan view, a part of the ring-shaped gate electrode is provided opposite to the channel region of the semiconductor layer adjacent to the second junction region thereof at one side of the second junction region thereof. In addition, in a plan view, another part of the ring-shaped gate electrode is provided opposite to the pixel-electrode-side source/drain region of the semiconductor layer adjacent to the second junction region thereof at the other opposite side of the second junction region thereof. Such a ring-like structure of a gate electrode according to the first aspect of the invention described above makes it possible to shut off any incident light beam that enters through upper layers over (above) the channel-region-overlapping portion of the gate electrode that is formed opposite to the channel region of the semiconductor layer or upper layers over the pixel-electrode-side portion of the gate electrode that is formed opposite to the pixel-electrode-side source/drain region of the semiconductor layer (and propagates) toward the second junction region of the semiconductor layer at an oblique angle. As explained above, the channel-region-overlapping portion of the gate electrode is formed opposite to the channel region of the semiconductor layer that is adjacent to the second junction region thereof at the above-mentioned one side of the second junction region thereof, whereas the pixel-electrode-side portion of the gate electrode is formed opposite to the pixel-electrode-side source/drain region of the semiconductor layer that is adjacent to the second junction region thereof at the above-mentioned other opposite side of the second junction region thereof. In addition, another portion of the ring-shaped gate electrode is formed adjacent to or close to, in a plan view, another side of the second junction region of the semiconductor layer, where the above-mentioned another side of the second junction region is not the above-mentioned one side thereof or the above-mentioned other opposite side thereof. Further in addition, still another portion of the ring-shaped gate electrode is formed adjacent to or close to, in a plan view, still another side of the second junction region of the semiconductor layer, where the above-mentioned still another side of the second junction region is not the above-mentioned one side thereof, the above-mentioned other opposite side thereof, or the above-mentioned another side thereof. The above-mentioned still another side of the second junction region of the semiconductor layer is the opposite side of the above-mentioned another side thereof. With such a structure, each of "side" portions of the ring-shaped gate electrode that are formed adjacent to or close to the above-mentioned another side of the second junction region of the semiconductor layer and the above-mentioned still another side of the second junction region thereof can shut off incident light that propagates toward the second junction region thereof at an oblique angle.

As will be described in detail later, the present inventors empirically found that an optical leakage current would be more likely to be generated at the switching element when light is irradiated to the second junction region of the semiconductor layer thereof than when light is irradiated to the first junction region of the semiconductor layer thereof. In this respect, in the configuration of an electro-optical device according to the first aspect of the invention described above, a ring-shaped gate electrode provides enhanced/reinforced light-shielding protection for the second junction region. Therefore, it is possible to effectively prevent the occurrence of any optical leakage current.

As explained above, the second junction region of the semiconductor layer is not covered by the ring-shaped gate electrode as viewed in the direction of a normal line to the surface of the substrate. Because of such a structure, the vertical light-shielding capability of the gate electrode is low. That is, the ring-shaped gate electrode cannot effectively shut off an incident light beam that enters/propagates through upper layers toward the second junction region of the semiconductor layer in a vertical direction. In order to produce high light-shielding effects even against such a vertical light beam, in the configuration of an electro-optical device according to the first aspect of the invention described above, at least a part of the second junction region of the semiconductor layer is formed in a cross region at which the data line and the scanning line intersect each other in a plan view over the substrate. The cross region at which the light-shielding data line and the light-shielding scanning line intersect each other in a plan view offers excellent light-shielding protection. Therefore, if the configuration of an electro-optical device according to the first aspect of the invention described above is adopted, it is possible to offset low vertical light-shielding capability of a gate electrode by high light-shielding capability of the cross region. Therefore, as a whole, an electro-optical device according to the first aspect of the invention described above features excellent light-shielding capability while effectively preventing any malfunction of switching elements such as transistors thereof.

In addition, if the configuration of an electro-optical device according to the first aspect of the invention described above is adopted, it is possible to provide a pinpoint light-shielding structure for the enhanced protection of the second junction region of the semiconductor layer among all regions thereof without any need to provide an extra light-shielding region in addition to the cross region for the optical protection thereof. Therefore, such a pinpoint light-shielding structure for the enhanced protection of the second junction region of the semiconductor layer among all regions thereof makes it possible to prevent the layout area of the non-open region (i.e., non-aperture area which blocks and shuts off light) of each pixel from being wastefully and/or inefficiently wide, which inevitably results in the reduction in the area size of the open region (i.e., aperture area in each pixel which transmits or reflects light that actually contributes to display) of each pixel. Since the unique light-shielding structure of an electro-optical device according to the first aspect of the invention described above makes it possible to avoid such reduction in the area size of the open region of each pixel, it is possible to maintain a high numerical aperture even when the configuration of each pixel is made finer while providing pinpoint light-shielding effects for the enhanced protection of the second junction region of the semiconductor layer among all regions thereof.

In the configuration of an electro-optical device according to the first aspect of the invention described above, the ring-shaped gate electrode surrounds and/or encloses the contour/periphery of the second junction region of the semiconductor layer of the switching element as viewed in the direction of a normal line to the surface of the substrate in such a manner that the second junction region thereof is exposed in the center open area of the ring-shaped gate electrode. Generally speaking, if the gate electrode were provided in close proximity to the second junction region of the semiconductor layer with a very small distance that is, for example, substantially equal to the thickness of a gate insulation film, either the electrode portion thereof or the wiring portion thereof would undesirably function as an electrode that applies more or less the same electric potential (i.e., voltage) as a gate voltage to the second junction region thereof, which should be avoided. That is, unintended change in carrier density would occur at the second junction region thereof, which is undesirable. If such unintended change in carrier density occurs, an optical leakage current and/or ON/OFF threshold variation as well as other similar problems might occur at a thin film transistor to the channel region of which a gate voltage is supposed to be applied for channel formation.

In order to avoid such problems, in the configuration of an electro-optical device according to the first aspect of the invention, as explained above, the second junction region of the semiconductor layer is not covered by the ring-shaped gate electrode and thus is exposed in the center open area of the ring-shaped gate electrode. Therefore, the gate electrode is not provided in close proximity to the second junction region of the semiconductor layer. For this reason, since unintended change in carrier density does not occur at the second junction region thereof, an optical leakage current and/or ON/OFF threshold variation as well as other similar problems does not occur at a switching element. Thus, it is possible to effectively prevent the switching element from malfunctioning.

As explained above, an electro-optical device according to the first aspect of the invention described above makes it possible to completely prevent or at least substantially reduce the occurrence of an optical leakage current in a switching element such as a transistor though not limited thereto that is electrically connected to a pixel electrode, and thereby preventing or reducing image problems such as flickers, though not limited thereto, without sacrificing numerical aperture. Thus, an electro-optical device according to the first aspect of the invention described above makes it possible to display images with high quality.

In the configuration of an electro-optical device according to the first aspect of the invention described above, it is preferable that the second junction region of the semiconductor layer of the switching element should be an LDD region. In the preferred configuration of an electro-optical device according to the first aspect of the invention described above, the switching element is embodied as an LDD thin film transistor whose semiconductor layer has at least one LDD region, which is an impurity region formed by implanting impurities therein by using, for example, an ion implantation method, or other alternative method. In addition to the second junction region of the semiconductor layer thereof, the first junction region thereof may also be formed as an LDD region.

Generally speaking, If any optical leakage current were generated in the second junction region of the semiconductor layer that is formed as an LDD region (hereafter referred to as "pixel-electrode-side LDD region"), because of the operating characteristic of an LDD transistor having an LDD structure, the amount of an OFF-state current that flows in the data-line-side source/drain region thereof and the pixel-electrode-side source/drain region thereof during the non-operating time of the transistor would increase, which is undesirable.

In this respect, in the preferred configuration of an electro-optical device according to the first aspect of the invention described above, the ring-shaped gate electrode can effectively shut off an incident light beam that propagates toward the pixel-electrode-side LDD region of the semiconductor layer. Therefore, it is possible to effectively prevent an increase in the amount of an OFF-state current that flows in the data-line-side source/drain region thereof and the pixel-electrode-side source/drain region thereof during the non-operating time of the transistor. For this reason, the preferred configuration of an electro-optical device according to the first aspect of the invention described above makes it possible to display images with high quality.

In the configuration of an electro-optical device according to the first aspect of the invention described above, it is preferable that the gate electrode of the switching element should be provided opposite to the pixel-electrode-side source/drain region of the semiconductor layer thereof with an interlayer insulation film being interposed between the gate electrode of the switching element and the pixel-electrode-side source/drain region of the semiconductor layer thereof; and the interlayer insulation film that is interposed between the gate electrode of the switching element and the pixel-electrode-side source/drain region of the semiconductor layer thereof should be formed as the same layer as the gate insulation film.

In the preferred configuration of an electro-optical device according to the first aspect of the invention described above, the interlayer insulation film that is interposed between the gate electrode of the switching element and the pixel-electrode-side source/drain region of the semiconductor layer thereof is formed as the same layer as the gate insulation film. In the context of this specification and appended claims, the term "same layer" means two (or more) layers that are formed concurrently with each other (or one another) in the same single film formation process. Note that the thickness (though not limited thereto) of the gate insulation film may not be the same as the thickness of the interlayer insulation film.

At the time of the operation of a switching element such as a transistor, an electric field is generated at a portion of the gate electrode thereof that is formed opposite to the channel region of the semiconductor layer thereof, which may be hereafter referred to as "channel-region-overlapping portion" of the gate electrode. In like manner, at the time of the operation of the switching element, an electric field is generated at another portion of the gate electrode thereof that is formed opposite to the pixel-electrode-side source/drain region of the semiconductor layer thereof, which may be hereafter referred to as "pixel-electrode-side portion" of the gate electrode. The pixel-electrode-side source/drain region of the semiconductor layer that is formed opposite to the pixel-electrode-side portion of the gate electrode is a heavily doped electro-conductive layer unlike the channel region thereof. Despite the fact that the pixel-electrode-side portion of the gate electrode is formed opposite to the pixel-electrode-side source/drain region of the semiconductor layer, there is no risk at all, or almost no risk or a very small risk in a practical sense, if any, that any electric field that is generated at the pixel-electrode-side portion of the gate electrode at the time of the operation of the switching element adversely affects the pixel-electrode-side source/drain region of the semiconductor layer thereof because the pixel-electrode-side source/drain region of the semiconductor layer is formed as a heavily doped electro-conductive layer. Since the semiconductor layer thereof is free from such adverse electric effects caused by any electric field that is generated at the pixel-electrode-side portion of the gate electrode at the time of the operation of the switching element, it is possible to completely eliminate or substantially reduce the risk of the malfunction of the switching element. For this reason, an electro-optical device having a preferred configuration described above makes it possible to completely prevent or at least substantially reduce the occurrence of an optical leakage current in a switching element such as a transistor though not limited thereto that is electrically connected to a pixel electrode and thus to make the switching element free from any operation failure, thereby preventing or reducing image problems such as flickers, though not limited thereto. Thus, an electro-optical device having a preferred configuration described above is capable of displaying images with high quality.

In the configuration of an electro-optical device according to the first aspect of the invention described above, it is preferable that the gate electrode of the switching element should be provided opposite to the pixel-electrode-side source/drain region of the semiconductor layer thereof with an interlayer insulation film being interposed between the gate electrode of the switching element and the pixel-electrode-side source/drain region of the semiconductor layer thereof; and the interlayer insulation film that is interposed between the gate electrode of the switching element and the pixel-electrode-side source/drain region of the semiconductor layer thereof should be formed as a multilayer film that is made up of one film layer that is the same layer as the gate insulation film and another film layer that is formed on the above-mentioned one film layer or another set of film layers that are formed on and over the above-mentioned one film layer.

In the preferred configuration of an electro-optical device according to the first aspect of the invention described above, the interlayer insulation film that is interposed between the gate electrode of the switching element and the pixel-electrode-side source/drain region of the semiconductor layer thereof is formed as a multilayer film that is made up of one film layer that is the same layer as the gate insulation film and another film layer that is formed on the above-mentioned one film layer or another set of film layers that are formed on and over the above-mentioned one film layer. Since the interlayer insulation film is formed as a multilayer film, it is possible to completely eliminate or substantially reduce a risk that any electric field that is generated at the pixel-electrode-side portion of the gate electrode at the time of the operation of the switching element adversely affects the pixel-electrode-side source/drain region of the semiconductor layer thereof. Thus, it is possible to further effectively prevent the switching element from malfunctioning.

In the configuration of an electro-optical device according to the first aspect of the invention described above, it is preferable that the gate electrode of the switching element should be provided opposite to the pixel-electrode-side source/drain region of the semiconductor layer thereof with a protection film being interposed between the gate electrode of the switching element and the pixel-electrode-side source/drain region of the semiconductor layer thereof; and the protection film that is interposed between the gate electrode of the switching element and the pixel-electrode-side source/drain region of the semiconductor layer thereof should function as a protective stopper at the time when a layer or layers formed over the protection film is/are etched away, removed, or treated in other way for patterning.

In the preferred configuration of an electro-optical device according to the first aspect of the invention described above, the gate electrode of the switching element is provided opposite to the pixel-electrode-side source/drain region of the semiconductor layer thereof with a protection film being interposed between the gate electrode of the switching element and the pixel-electrode-side source/drain region of the semiconductor layer thereof. In addition to the protection film, an interlayer insulation film such as one described above and/or other film(s) may be formed between the gate electrode of the switching element and the pixel-electrode-side source/drain region of the semiconductor layer thereof.

In the preferred configuration of an electro-optical device according to the first aspect of the invention described above, the protection film that is interposed between the gate electrode of the switching element and the pixel-electrode-side source/drain region of the semiconductor layer thereof functions as a protective stopper at the time when a layer or layers formed over the protection film is/are etched away, removed, or treated in other way for patterning. The protection film prevents a layer(s) that is formed under the protection film from being damaged at the time when a layer(s) that is formed over the protection film is etched away, removed, or treated in other similar or alternative way. For example, the protection film prevents the semiconductor layer that is formed immediately under the protection film from being damaged at the time when an upper film such as an insulation film that is formed immediately over the protection film is etched away, removed, or treated in other similar or alternative way. Since etching, film removal, or other treatment can be performed without requiring high precision, it is possible to simplify the manufacturing process of an electro-optical device. In addition, it is possible to shorten production time thereof.

In the configuration of an electro-optical device according to the first aspect of the invention described above, it is preferable that the channel region of the semiconductor layer of the switching element should be formed substantially outside the cross region in a plan view over the substrate; and at least a part of the channel region of the semiconductor layer thereof should be formed inside a region that is covered by the data line in a plan view over the substrate.

In the preferred configuration of an electro-optical device according to the first aspect of the invention described above, the second junction region of the semiconductor layer of the switching element that is adjacent to the channel region of the semiconductor layer thereof is formed in the cross region in such a manner that the channel region of the semiconductor layer thereof is formed substantially outside the cross region in a plan view over the substrate and further in such a manner that at least a part of the channel region of the semiconductor layer thereof is formed inside a region that is covered by the data line in a plan view over the substrate. As has already been described above, the cross region has high light-shielding property. Therefore, the preferred configuration of an electro-optical device according to the first aspect of the invention described above makes it possible to effectively shut off an incident light beam that propagates toward the second junction region of the semiconductor layer thereof by means of the cross region having high light-shielding capability. Therefore, it is possible to prevent the occurrence of any optical leakage current in a reliable manner. Thus, an electro-optical device having the preferred configuration described above is capable of displaying images with high quality.

In the configuration of an electro-optical device according to the first aspect of the invention described above, it is preferable that the data-line-side source/drain region of the semiconductor layer of the switching element should be formed outside the cross region and inside a region that is covered by the data line in a plan view over the substrate.

In the preferred configuration of an electro-optical device according to the first aspect of the invention described above, the second junction region of the semiconductor layer of the switching element, which is distanced from the data-line-side source/drain region of the semiconductor layer thereof with at least the channel region of the semiconductor layer thereof being interposed between the second junction region of the semiconductor layer thereof and the data-line-side source/drain region of the semiconductor layer thereof, is formed in the cross region in such a manner that the data-line-side source/drain region of the semiconductor layer thereof is formed outside the cross region and inside a region that is covered by the data line in a plan view over the substrate. As has already been described above, the cross region has high light-shielding property. Therefore, the preferred configuration of an electro-optical device according to the first aspect of the invention described above makes it possible to effectively shut off an incident light beam that propagates toward the second junction region of the semiconductor layer thereof by means of the cross region having high light-shielding capability. Therefore, it is possible to prevent the occurrence of any optical leakage current in a reliable manner. Thus, an electro-optical device having the preferred configuration described above is capable of displaying images with high quality.

In the configuration of an electro-optical device according to the first aspect of the invention described above, it is preferable that the pixel-electrode-side source/drain region of the semiconductor layer of the switching element should be formed outside the cross region and inside a region that is covered by the data line in a plan view over the substrate.

In the preferred configuration of an electro-optical device according to the first aspect of the invention described above, the second junction region of the semiconductor layer of the switching element that is adjacent to the pixel-electrode-side source/drain region of the semiconductor layer thereof is formed in the cross region in such a manner that the pixel-electrode-side source/drain region of the semiconductor layer thereof is formed outside the cross region in a plan view over the substrate and further in such a manner that at least a part of the pixel-electrode-side source/drain region of the semiconductor layer thereof is formed inside a region that is covered by the data line in a plan view over the substrate. As has already been described above, the cross region has high light-shielding property. Therefore, the preferred configuration of an electro-optical device according to the first aspect of the invention described above makes it possible to effectively shut off an incident light beam that propagates toward the second junction region of the semiconductor layer thereof by means of the cross region having high light-shielding capability. Therefore, it is possible to prevent the occurrence of any optical leakage current in a reliable manner. Thus, an electro-optical device having the preferred configuration described above is capable of displaying images with high quality.

In the configuration of an electro-optical device according to the first aspect of the invention described above, it is preferable that the gate electrode of the switching element should be formed as a part of the scanning line; and the gate electrode of the switching element should be made of the same film as the scanning line in such a manner that the gate electrode thereof and the scanning line constitute the same single pattern that is formed on the same layer.

In the preferred configuration of an electro-optical device according to the first aspect of the invention described above, the gate electrode of the switching element is formed as a part of the scanning line In addition, in the preferred configuration of an electro-optical device according to the first aspect of the invention described above, the gate electrode of the switching element is made of the same film as the scanning line in such a manner that the gate electrode thereof and the scanning line constitute the same single pattern that is formed on the same layer. If the preferred configuration of an electro-optical device according to the first aspect of the invention described above is adopted, it is possible to form the gate electrode of the switching element and the scanning line by means of the same film in the same single film formation process. Therefore, it is possible to shorten the production time of an electro-optical device while simplifying the manufacturing process thereof.

In order to address the above-identified problem without any limitation thereto, the invention provides, as a second aspect thereof, an electronic apparatus that is provided with an electro-optical device according to the first aspect of the invention, which has any of the configurations described above, including its preferred or modified configurations.

According to an electronic apparatus of this aspect of the invention, it is possible to embody various kinds of electronic devices that are capable of providing a high-quality image display, including but not limited to, a projection-type display device, a television, a mobile phone, an electronic personal organizer, a word processor, a viewfinder-type video tape recorder, a direct-monitor-view-type video tape recorder, a workstation, a videophone, a POS terminal, a touch-panel device, and so forth, because the electronic apparatus of this aspect of the invention is provided with the electro-optical device according to the above-described aspect of the invention. In addition, as another non-limiting application example thereof, an electronic apparatus of this aspect of the invention may be also embodied as an electrophoresis apparatus such as an electronic paper.

These and other features, operations, and advantages of the present invention will be fully understood by referring to the following detailed description of exemplary embodiments in conjunction with the accompanying drawings.

BRIEF DESCRIPTION OF THE DRAWINGS

The invention will be described with reference to the accompanying drawings, wherein like numbers reference like elements.

DESCRIPTION OF EXEMPLARY EMBODIMENTS

With reference to the accompanying drawings, exemplary embodiments of the present invention are described below. In the following exemplary embodiments of the invention, a liquid crystal device that conforms to a TFT active-matrix driving scheme is taken as an example of various kinds of electro-optical devices according to some aspects of the invention. It is assumed that the liquid crystal device explained in the following description is provided with a built-in driving circuit.

First Embodiment

Figure 1:
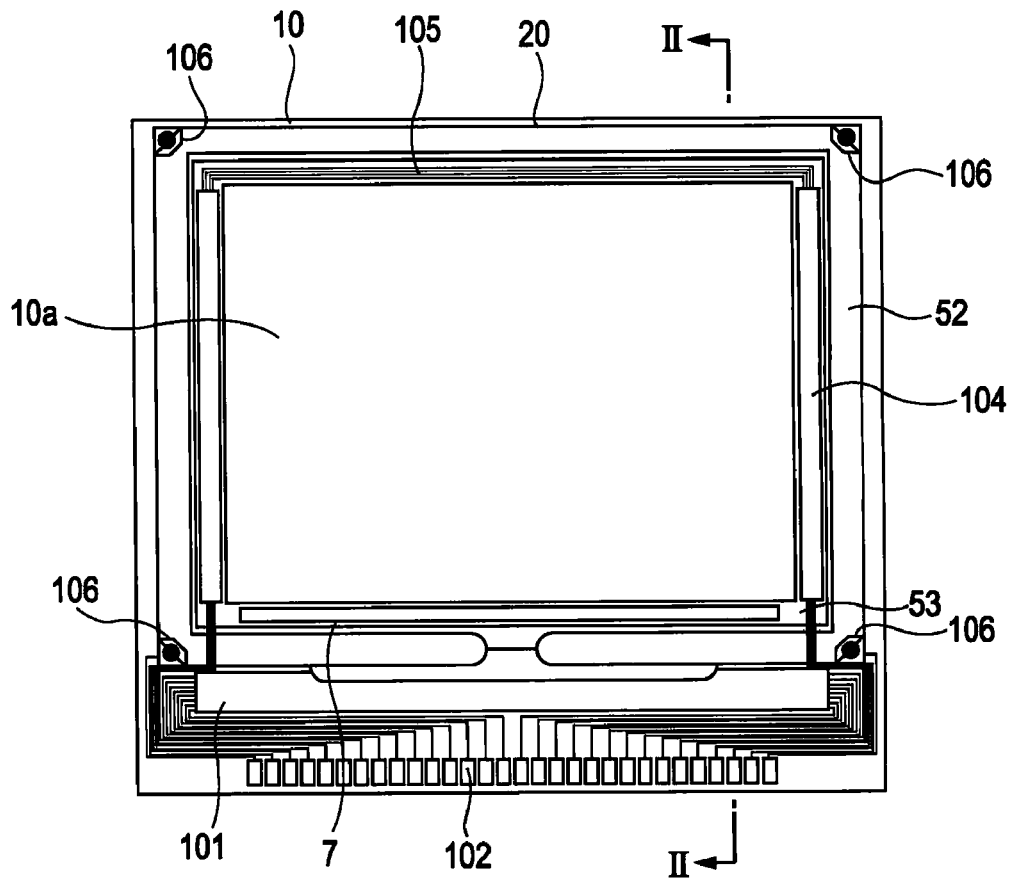
FIG. 1 is a plan view that schematically illustrates an example of the configuration of a liquid crystal device according to a first exemplary embodiment of the invention.
Figure 2:
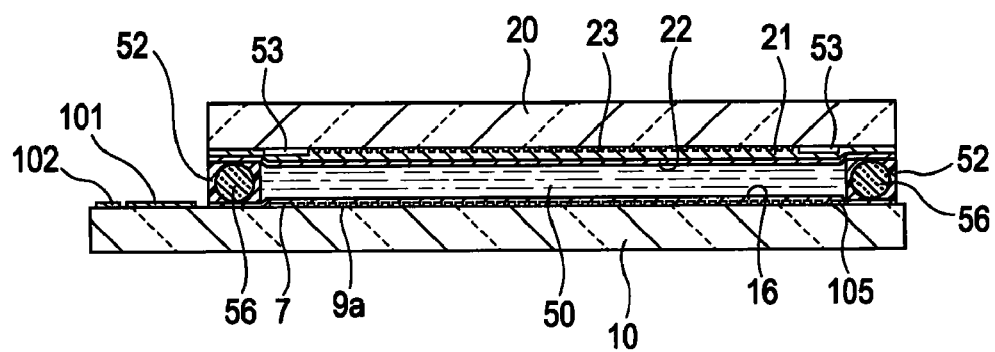
FIG. 2 is a sectional view taken along the line II-II of FIG. 1.

First of all, an example of the general configuration of a liquid crystal device according to the first exemplary embodiment of the invention is explained below while referring to FIGS. 1 and 2. FIG. 1 is a plan view that schematically illustrates an example of the configuration of a TFT array substrate and various components formed or deposited thereon, which are viewed from a certain point at the counter-substrate side, or from above the counter substrate. FIG. 2 is a sectional view taken along the line II-II of FIG. 1.

As shown in FIGS. 1 and 2, a liquid crystal device according to the present embodiment of the invention is mainly made up of a TFT array substrate 10 and a counter substrate 20 that are provided opposite to each other. The TFT array substrate 10 is a transparent substrate that is made of, for example, a quartz substrate, a glass substrate, a silicon substrate, or the like. The counter substrate 20 is also configured as a transparent substrate that is made of the same material as that of the TFT array substrate 10, though not necessarily limited thereto. A liquid crystal layer 50 is sealed between the TFT array substrate 10 and the counter substrate 20. The TFT array substrate 10 and the counter substrate 20 are bonded to each other with the use of a sealant material 52 that is provided at a sealing region around an image display region 10a.

The sealant material 52 is made from, for example, an ultraviolet (UV) curable resin, a thermosetting resin, or the like, which functions to paste these substrates together. In the production process of the liquid crystal device according to the present embodiment of the invention, the sealant material 52 is applied onto the TFT array substrate 10 and subsequently hardened through an ultraviolet irradiation treatment, a heat treatment, or any other appropriate treatment. A gap material 56 such as glass fibers, glass beads, or the like, are scattered in the sealant material 52 so as to set the distance (i.e., inter-substrate gap) between the TFT array substrate 10 and the counter substrate 20 at a predetermined gap value. A liquid crystal device according to the present embodiment of the invention is suitable for providing an enlarged display with a compact body, and especially preferable to be used as a light valve for a projector among many uses thereof.

Inside the sealing region at which the sealant material 52 is provided, and in parallel therewith, a picture frame light-shielding film 53, which has a light-shielding property and defines the picture frame region of the image display region 10*a*, is provided on the counter substrate 20. Notwithstanding the above, however, a part or a whole of the picture frame light-shielding film 53 may be provided at the TFT-array-substrate (10) side as a built-in light-shielding film.

A data line driving circuit 101, a sampling circuit 7, a scanning line driving circuit(s) 104, and external circuit connection terminals 102 are formed at peripheral regions around the above-mentioned image display region 10*a* on the TFT array substrate 10.

Among the peripheral regions (or, in other words, several regions that make up a peripheral region), which lie at the periphery of the image display region 10*a*, the data line driving circuit 101 and the external circuit connection terminals 102 are provided at one region which lies outside the sealing region at which the sealant material 52 is provided in such a manner that these data line driving circuit 101 and external circuit connection terminals 102 are provided along one of four sides of the TFT array substrate 10. On the other hand, among the peripheral regions that lie at the periphery of the image display region 10*a*, the sampling circuit 7 is provided at one region that lies inside the sealing region at which the sealant material 52 is provided. The sampling circuit 7 is provided along one of four sides of the image display region 10*a* in such a manner that the picture frame light-shielding film 53 encloses the sampling circuit 7.

A pair of scanning line driving circuits 104 is provided along two of four sides of the TFT array substrate 10 that are not in parallel with the above-mentioned one side in such a manner that each of the scanning line driving circuits 104 is enclosed by the picture frame light-shielding film 53. In addition to the above, a plurality of electric wirings 105 is provided along the remaining one side (i.e., one that is parallel with the first-mentioned side) of the TFT array substrate 10 in such a manner that the plurality of electric wirings 105 is enclosed by the picture frame light-shielding film 53 so as to electrically connect one of the pair of the scanning line driving circuits 104 that are provided outside the image display region 10*a* along the second-mentioned two sides of the TFT array substrate 10 to the other thereof.

Inter-substrate conductive terminals 106 are provided at the peripheral regions on the TFT array substrate 10, specifically, at positions corresponding to four corners of the counter substrate 20, respectively. In addition, inter-substrate conductive materials are provided between the TFT array substrate 10 and the counter substrate 20, specifically, at positions corresponding to the inter-substrate conductive terminals 106. The inter-substrate conductive terminals 106 and the inter-substrate conductive materials are configured to fit with each other so as to establish electric connection between the TFT array substrate 10 and the counter substrate 20.

In FIG. 2, a layered structure that includes laminations of TFTs for pixel switching, which are driver elements, and of wirings such scanning lines, data lines, and so on, is formed on the TFT array substrate 10. In the image display region 10*a*, pixel electrodes 9*a* are arranged in a matrix pattern at a layer above the lamination structure of the pixel-switching TFTs, the scanning lines, the data lines, and the like. An alignment (i.e., orientation) film 16 is deposited on the pixel electrodes 9*a*. It should be noted that, in the present embodiment of the invention, the pixel-switching element is not limited to a TFT but may be configured as a transistor of any other alternative type. Or, the pixel-switching element may be configured as a TFD. Needless to say, the pixel-switching element can be embodied as any other kind of device that is not specifically described herein.

On the other hand, a light-shielding film 23 is deposited on the surface of the counter substrate 20 opposite the TFT array substrate 10. The light-shielding film 23 is made of, for example, a metal film having light-shielding property. The light-shielding film 23 is formed in a grid pattern, though not limited thereto, in the image display region 10*a* on the counter substrate 20. The counter electrode 21, which is made of a transparent material such as an ITO film, is deposited "on" the light-shielding film 23 in a solid manner, that is, as a solid electrode. In other words, the counter electrode 21 is formed under the light-shielding film 23 as illustrated in FIG. 2. The counter electrode 21 that is formed as a solid electrode is provided opposite to the plurality of pixel electrodes 9*a*. Another alignment film 22 is deposited on the counter electrode 21. As illustrated in FIG. 2, the above-mentioned another alignment film 22 is formed under the counter electrode 21.

The liquid crystal layer 50 is made of liquid crystal that consists of, for example, a mixture of one or more types of nematic liquid crystal element. Such a liquid crystal takes a predetermined orientation state between a pair of the above orientation films (i.e., alignment films). When the liquid crystal device is driven for operation, a driving voltage is applied to each of the pixel electrode 9*a* and the counter electrode 21. As a result of the application of a voltage thereto, a liquid crystal retention volume (i.e., liquid crystal hold capacitance) is generated between the pixel electrode 9*a* and the counter electrode 21.

It should be noted that other functional circuits that are not specifically illustrated in the drawing might also be provided on the TFT array substrate 10 in addition to driving circuits such as the data line driving circuit 101 and the scanning line driving circuit(s) 104 described above. A non-limiting example of such other functional circuits includes but not limited to a pre-charge circuit that supplies a pre-charge signal having a predetermined voltage level to each of the plurality of data lines prior to the supplying of an image signal, and a test circuit for conducting an inspection on the quality, defects, and the like of the liquid crystal device during the production process or before shipment thereof.

Figure 3:
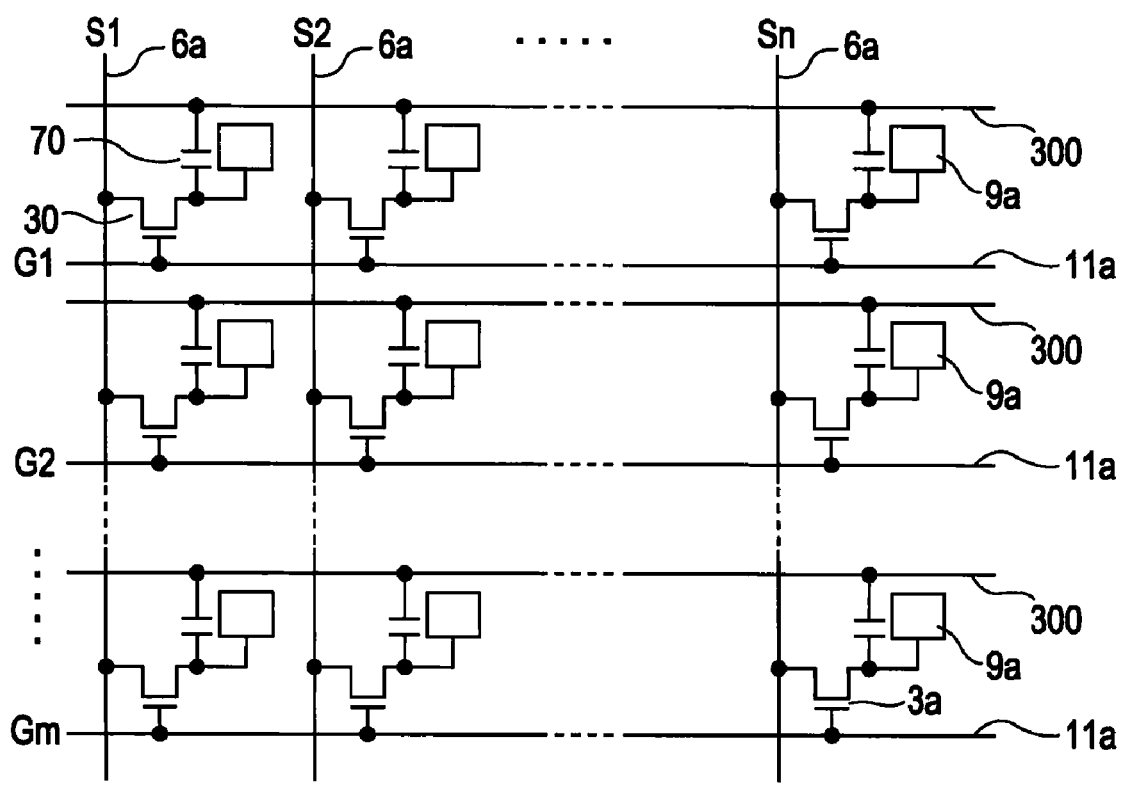
FIG. 3 is an equivalent circuit diagram that schematically illustrates an example of constituent elements and wirings in a plurality of pixels that are arranged in a matrix pattern so as to constitute the image display region of a liquid crystal device according to the first exemplary embodiment of the invention.

Next, the electric configuration of the pixel unit (i.e., pixel portion) of a liquid crystal device according to the present embodiment of the invention is explained below with reference to FIG. 3. FIG. 3 is an equivalent circuit diagram that schematically illustrates an example of constituent elements and wirings in a plurality of pixels that are arranged in a matrix pattern so as to constitute the image display region of a liquid crystal device according to the present embodiment of the invention.

As illustrated in FIG. 3, the pixel electrode 9*a* and a TFT 30 is provided in each of the plurality of pixels that are arranged in a matrix pattern to constitute the image display region 10*a*. The TFT 30 is electrically connected to the pixel electrode 9*a* so as to perform switching control on the pixel electrode 9*a* at the time of operation of the liquid crystal device. Each of data lines 6*a* to which image signals are supplied is electrically connected to the source of the TFT 30. Image signals S1, S2, . . . , and Sn that are written on the data lines 6*a* may be supplied respectively in this order in a line sequential manner. Alternatively, an image signal may be supplied to each of a plurality of groups thereof. Each group consists of a bundle of the data lines 6*a* arrayed adjacent to one another.

Each of scanning lines 11a is connected to the gate of the TFT 30. The liquid crystal device according to the present embodiment of the invention is configured to apply, at a predetermined timing and in a pulse pattern, scanning signals G1, G2, . . . , and Gm to the scanning lines 11a in this order in a line sequential manner. Each of the pixel electrodes 9a is electrically connected to the drain of the TFT 30. When the switch of the TFT 30, which functions as a switching element, is closed for a certain time period, the image signal S1, S2, . . . , or Sn that is supplied through the data line 6a is written at a predetermined timing. After being written into liquid crystal, which is an example of electro-optical material, via the pixel electrodes 9a, the image signals S1, S2, . . . , and Sn having a predetermined level are held for a certain time period between the pixel electrode 9a and the counter electrode formed on the counter substrate.

Since liquid crystal that constitutes the liquid crystal layer 50 (refer to FIG. 2) changes its orientation and/or order of molecular association depending on the level of a voltage being applied, it modulates light to realize gradation display. Under a "normally-white" mode, the optical transmittance, that is, light transmission factor, with respect to an incident light beam decreases in accordance with a voltage applied on a pixel-by-pixel basis (i.e., to each pixel), whereas, under a "normally-black" mode, the optical transmittance with respect to an incident light beam increases in accordance with a voltage applied on a pixel-by-pixel basis. Thus, when viewed as a whole, light having a certain contrast in accordance with an image signal is emitted from the liquid crystal device.

In order to prevent the leakage of the image signals being held, a storage capacitor 70 is added in electrically parallel with a liquid crystal capacitor that is formed between the pixel electrode 9a and the counter electrode 21 (refer to FIG. 2). The storage capacitor 70 is a capacitive element that functions as a hold capacitor or a retention volume for temporally holding the electric potential of each of the pixel electrodes 9a in accordance with the supply of an image signal. One electrode of the storage capacitor 70 is electrically connected to the drain of the TFT 30 in parallel connection with the pixel electrode 9a, whereas the other electrode thereof is electrically connected to a capacitor line 300 with a fixed electric potential so as to provide a constant electric potential (i.e., potentiostatic). The storage capacitor 70 improves the electric potential retention property at the pixel electrode 9a. Therefore, it is possible to improve display characteristics, which could be perceived as an enhanced contrast and/or reduced flickers. As will be described later, the storage capacitor 70 functions also as a built-in light-shielding film that shuts off light entering toward the TFT 30.

Figure 4:
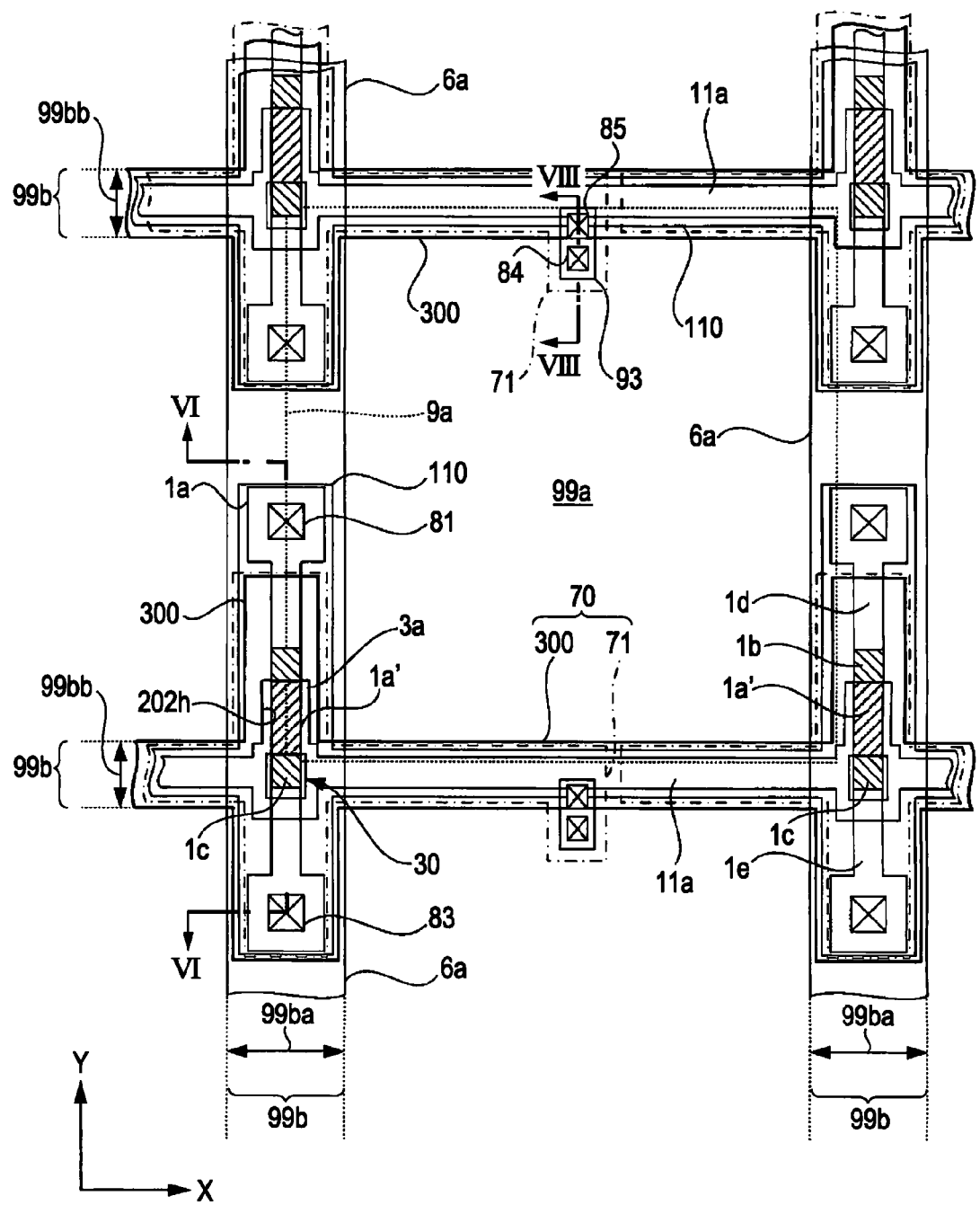
FIG. 4 is a plan view that schematically illustrates an example of the configuration of the pixel unit of a liquid crystal device according to the first exemplary embodiment of the invention.
Figure 5:
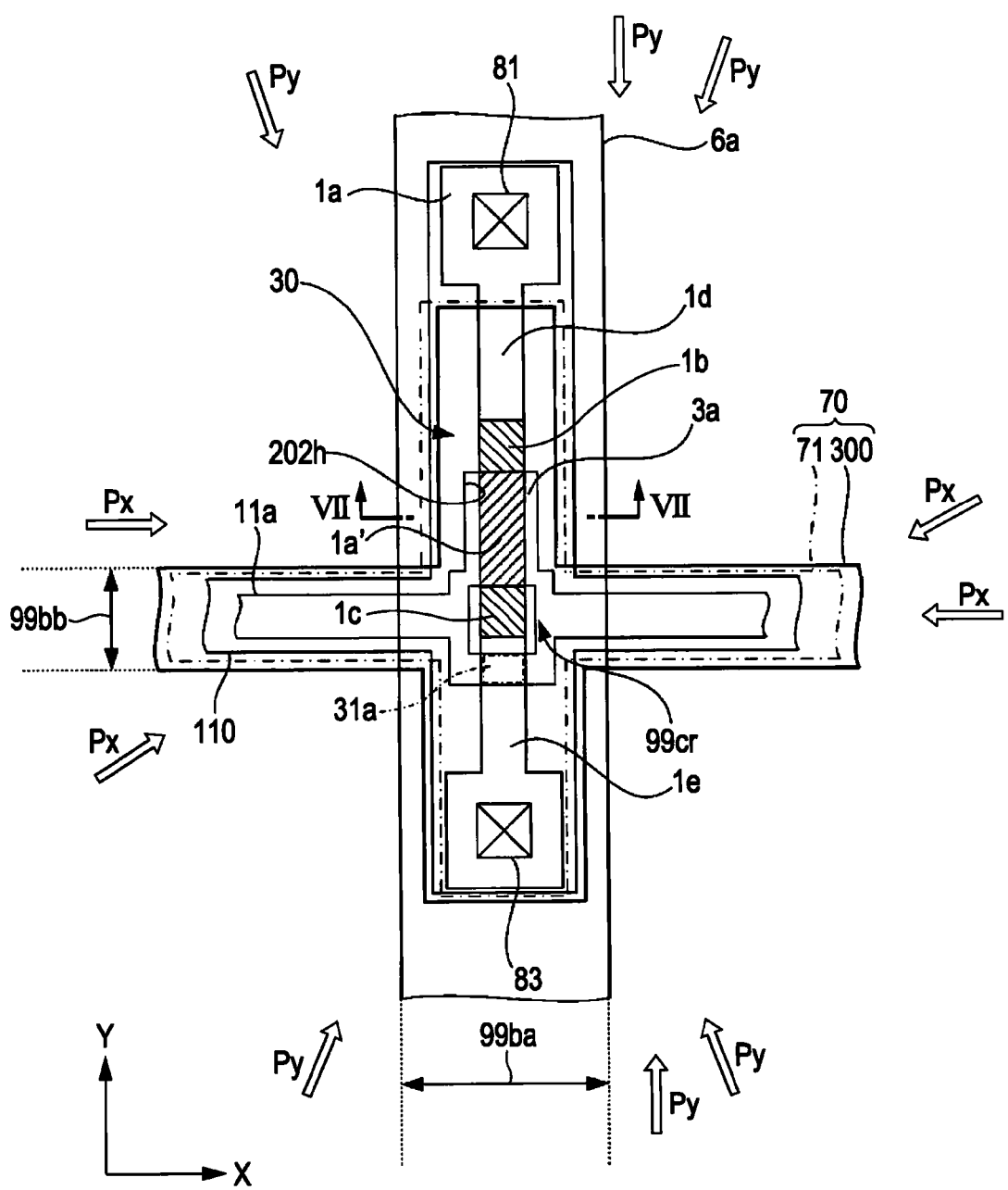
FIG. 5 is a partial plan view that schematically illustrates an example of the partial configuration of the pixel unit illustrated in FIG. 4, or more specifically, a transistor and other components thereof.
Figure 6:
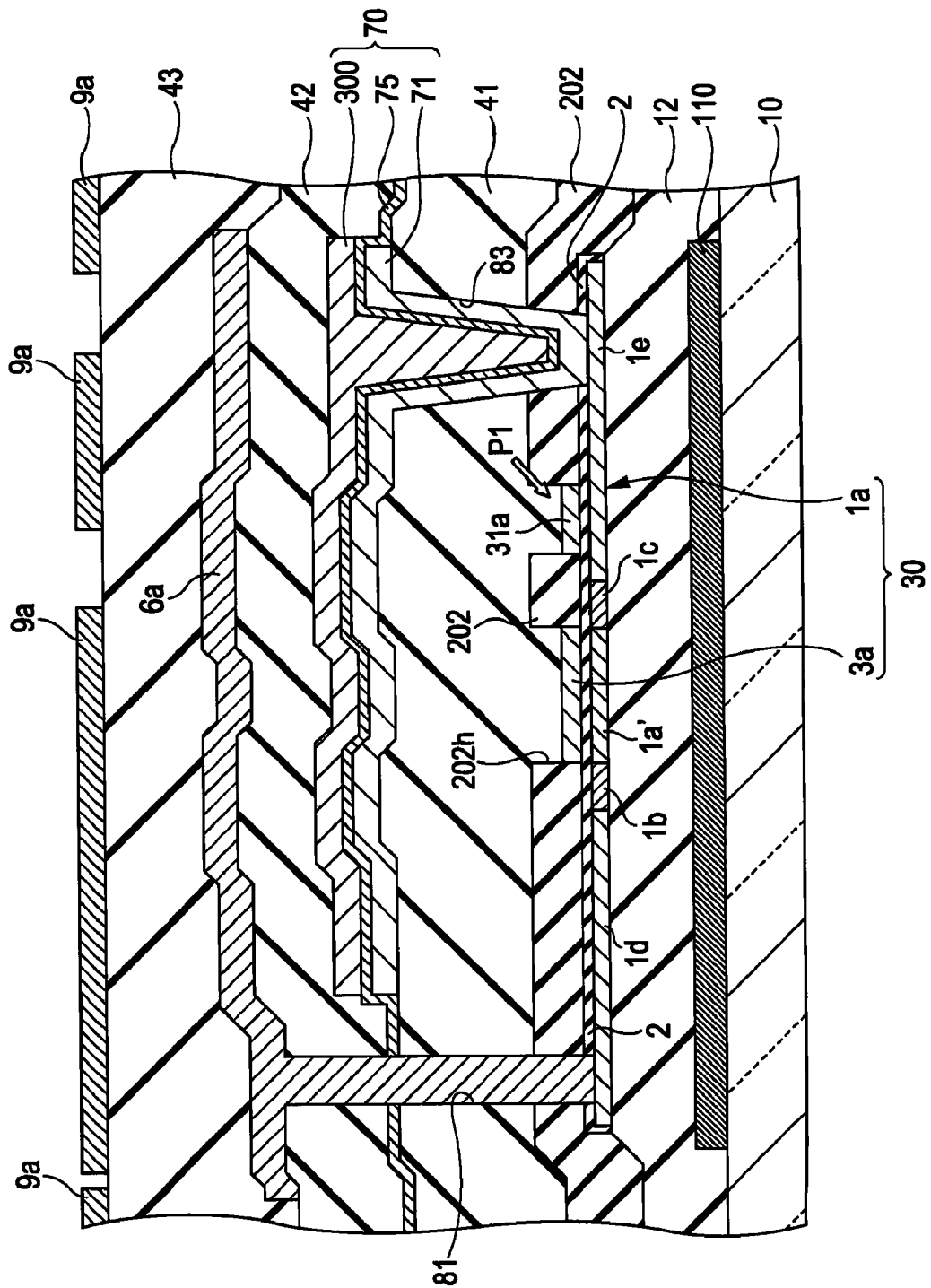
FIG. 6 is a sectional view taken along the line VI-VI of FIG. 4.
Figure 7:
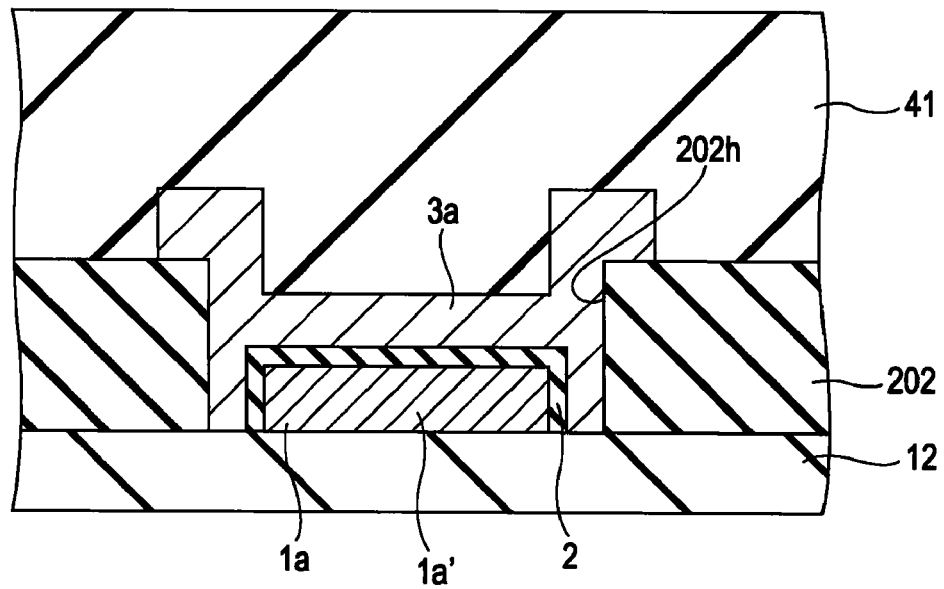
FIG. 7 is a sectional view taken along the line VII-VII of FIG. 5.
Figure 8:
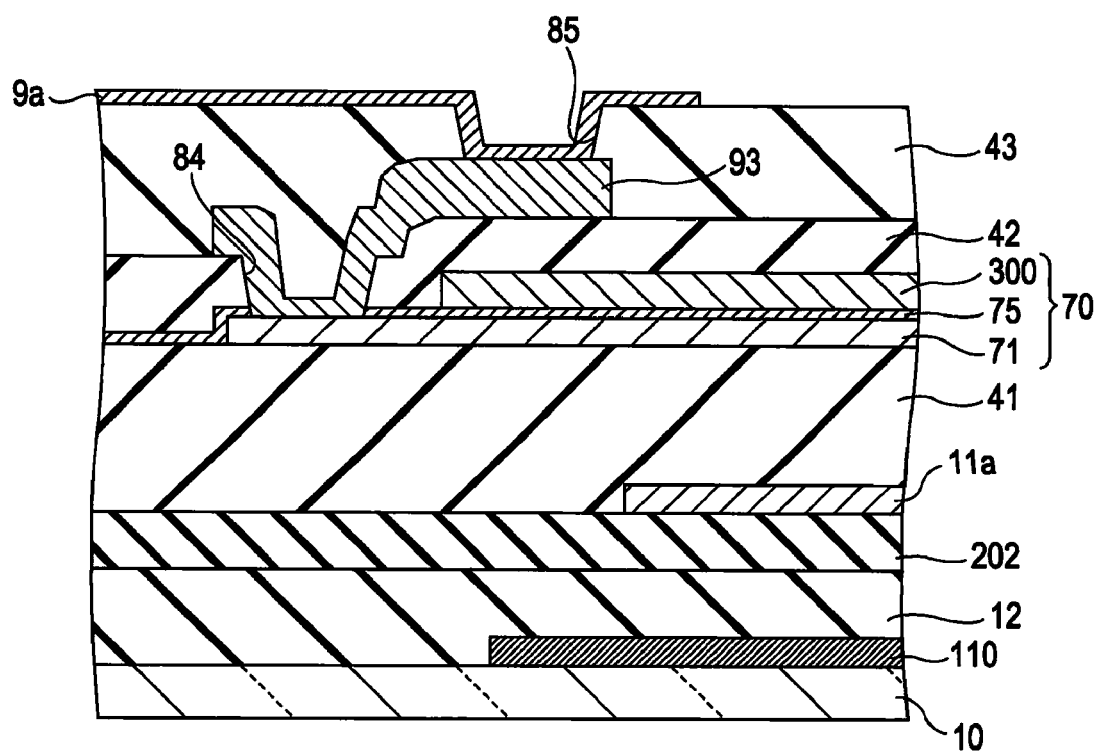
FIG. 8 is a sectional view taken along the line VIII-VIII of FIG. 4.

Next, with reference to FIGS. 4-8 as well as the above-referenced FIGS. 1-3, the specific configuration of the pixel portion (i.e., pixel unit) of a liquid crystal device according to the present embodiment of the invention that realizes the operation described above is explained below. FIG. 4 is a plan view that schematically illustrates an example of the configuration of the pixel unit of a liquid crystal device according to the present embodiment of the invention. FIG. 5 is a partial plan view that schematically illustrates an example of the partial configuration of the pixel unit illustrated in FIG. 4, or more specifically, a transistor and other components thereof. FIG. 6 is a sectional view taken along the line VI-VI of FIG. 4. FIG. 7 is a sectional view taken along the line VII-VII of FIG. 5. FIG. 8 is a sectional view taken along the line VIII-VIII of FIG. 4.

In referring to FIGS. 4-8, it should be noted that different scales are used for layers/members illustrated in these drawings so that each of the layers/members has a size that is easily recognizable therein. The same holds true for each of other accompanying drawings that will be referred to later. It should be noted that, in the following explanation made while making reference to FIGS. 4-8, layers/members (i.e., constituent elements) provided on the TFT array substrate 10 only are described among all layers/members that are described above while making reference to FIGS. 1 and 2, which means that layers/members provided on the counter substrate 20 are omitted from the following description. In addition, for convenience of explanation, in FIGS. 4-8, layer portions deposited above/over the pixel electrodes 9a are omitted from these drawings. FIG. 5 focuses on the transistor of the pixel unit of a liquid crystal device according to the present embodiment of the invention. In addition to the "regional" layout pattern of the transistor, FIG. 5 further schematically shows the relative layout of, or, in other words, the positional relationship between the transistor that is arrayed in a non-open region of the pixel and other films/layers constituting the data line, the scanning line, and the storage capacitor that are also arrayed in the non-open region of the pixel.

As illustrated in FIG. 4, the plurality of pixel electrodes 9a is arranged in a matrix pattern over the TFT array substrate 10. The data line 6a extends along a longitudinal boundary line between each two pixel electrodes 9a arrayed adjacent to each other. On the other hand, the scanning line 11a extends along a latitudinal boundary line between each two pixel electrodes 9a arrayed adjacent to each other. That is, the data line 6a extends in the Y direction as illustrated in FIG. 4. On the other hand, the scanning line 11a extends in the X direction so as to intersect with the data line 6a extending in the Y direction as illustrated in FIG. 4. The TFT 30 is provided at a position corresponding to each intersection where the data lines 6a and the scanning lines 3a intersect (i.e., traverse) each other. The TFT functions as a pixel-switching element. The pixel-switching TFT 30 is shown in FIG. 5 in an enlarged view.

When viewed in two dimensions, that is, in a plan view, the scanning line 11a, the data line 6a, the TFT 30, the storage capacitor 70, a lower light-shielding film 110, and a relay layer 93 are arranged inside a non-open region 99b that surrounds the open region 99a of each pixel corresponding to the pixel electrode 9a (where the term "open region" means an aperture area in each pixel which transmits or reflects light that actually contributes to display, whereas the term "non-open region" means an non-aperture area which blocks and shuts off light) over the TFT array substrate 10. In other words, the scanning line 11a, the data line 6a, the TFT 30, the storage capacitor 70, the lower light-shielding film 110, and the relay layer 93 are arranged not in the open region 99a of each pixel but in the non-open region 99b thereof so as not to obstruct display.

The non-open region 99b is defined as a light-shielding area that is formed at the TFT-array-substrate (10) side in such a manner that it can shut off an incident light beam that enters into each pixel. For example, at least a part of an electro-conductive film that constitutes the data line 6a, the scanning line 11a, or the storage capacitor 70 at the TFT-array-substrate side is formed as a light-shielding film that has light-shielding property. The non-open region 99b can block light through the functioning of such a light-shielding film. More specifically, the non-open region 99b is made up of a first light-shielding region 99ba and a second light-shielding region 99bb. The first light-shielding region 99ba of the non-open region 99b extends in the Y direction, whereas the second light-shielding region 99bb thereof extends in the X direction. It is preferable that the light-shielding film 23, which is formed on the surface of the counter substrate 20 opposite the TFT array substrate 10 as has already been explained above while referring to FIG. 2, should be formed as a part of the non-open region 99b described above. That is, preferably, a combination of the above-described TFT-array-substrate-side light-shielding film and the light-shielding film 23, the latter of which is formed at the counter-substrate (20) side, should make up the non-open region 99b described above.

In the following description, a detailed explanation is given of component layers that make up the lamination structure of the pixel units formed over the TFT array substrate 10. First of all, while making reference to FIG. 6, the structure of the undermost first layer thereof is explained below.

The lower light-shielding film 110 is formed at a layer over the TFT array substrate 10. In the illustrated example of FIG. 6, the lower light-shielding film 110 is formed on the TFT array substrate 10. The lower light-shielding film 110 is made of, for example, an electro-conductive material having light-shielding property such as a high melting point metal material and the like. A couple of examples of such a high melting point metal material include, without any limitation thereto, tungsten (W), titanium (Ti), and titanium nitride (TiN). As illustrated in FIG. 4 or FIG. 5, the lower light-shielding film 110 is formed in such a manner that it extends along a direction in which the scanning line 11a extends, that is, along the X direction. Specifically, the lower light-shielding film 110 is formed in a stripe pattern in the image display region 10a so as to cover a region corresponding to the scanning line 11a. Having such a configuration, the lower light-shielding film 110 makes it possible to shut off light (return light) that propagates toward the TFT 30 from the TFT array substrate (10) side. For example, thanks to the presence of the lower light-shielding film 110, it is possible to shut off, though not limited thereto, light attributable to backside reflection at the TFT array substrate 10, or light that is emitted from other liquid crystal device such as a multiple-plate type projector, or the like, to penetrate through a composite optical system, thereby effectively protecting the TFT 30.

In an exemplary layer structure that is illustrated in FIG. 6, an underlying insulation film (i.e., ground insulator film) 12 is formed on the lower light-shielding film 110. The underlying insulation film 12 is made of a silicon oxide film, though not limited thereto. The underlying insulation film 12, which is formed over the entire surface of the TFT array substrate 10, has a function of preventing any degradation in the characteristics and/or performance of the pixel-switching TFT 30 that is attributable to the surface roughness of the TFT array substrate 10 caused at the time of surface polishing thereof or attributable to any stains that remain without being removed completely after washing thereof, though not limited thereto.

As illustrated in FIGS. 4, 5, and 6, the TFT 30 has a semiconductor layer 1a and a gate electrode 3a.

The semiconductor layer 1a is made of, for example, polysilicon. As illustrated in FIGS. 4 and 5, the semiconductor layer 1a consists of a channel region 1a', a data-line-side LDD region 1b, a pixel-electrode-side LDD region 1c, a data-line-side source/drain region 1d, and a pixel-electrode-side source/drain region 1e. The channel region 1a' has a channel length along the Y direction. That is, the TFT 30 has an LDD structure. It should be noted that the data-line-side LDD region 1b is an example of "a first junction region" according to an aspect of the invention, whereas the pixel-electrode-side LDD region 1c is an example of "a second junction region" according to an aspect of the invention.

The data-line-side source/drain region 1d and the pixel-electrode-side source/drain region 1e are formed approximately in a mirror symmetry along the Y direction with respect to the channel region 1a'. Specifically, the data-line-side LDD region 1b is formed between the channel region 1a' and the data-line-side source/drain region 1d. The pixel-electrode-side LDD region 1c is formed between the channel region 1a' and the pixel-electrode-side source/drain region 1e. The data-line-side LDD region 1b, the pixel-electrode-side LDD region 1c, the data-line-side source/drain region 1d, and the pixel-electrode-side source/drain region 1e are impurity regions that are formed by implanting impurities into the semiconductor layer 1a by using, for example, an ion implantation method, or other alternative method. The data-line-side LDD region 1b and the pixel-electrode-side LDD region 1c are deposited as lightly doped (low concentration) impurity regions having less impurities than the data-line-side source/drain region 1d and the pixel-electrode-side source/drain region 1e, respectively. According to such an impurity region, it is possible to reduce the amount of an OFF-state current that flows in the source region and the drain region during the non-operating time of the TFT 30, and also to suppress the decrease of an ON-state current that flows during the operating time of the TFT 30. It should be noted that, although it is preferable that the TFT 30 has an LDD structure, it might be configured to have an offset structure in which the implantation of impurities is not performed on the data-line-side LDD region 1b and the pixel-electrode-side LDD region 1c. As another alternative example, it may be configured that impurities are heavily doped while using the gate electrode as a mask (i.e., high concentration) so as to deposit the data-line-side source/drain region and the pixel-electrode-side source/drain region, which may be referred to as a self-aligned structure.

The scanning line 11a is formed at a layer over the semiconductor layer 1a with an insulation film 202 being interposed therebetween. The insulation film 202 is made up of, though not necessarily limited thereto, a silicon oxide film. The scanning line 11a is made of, for example, conductive polysilicon. The scanning line 11a is formed in such a manner that it extends along the X direction. A part of the scanning line 11a is formed as the gate electrode 3a. The gate electrode 3a is partially formed inside an opening (i.e., open area) 202h that is formed at a certain region of the insulation film 202 that overlaps the channel region 1a' of the semiconductor layer 1a in a plan view. The gate electrode 3a has other portion that does not overlap the channel region 1a' of the semiconductor layer 1a in a plan view. As illustrated in FIGS. 4 and 5, the above-mentioned non-channel-region-overlapping portion of the gate electrode 3a is formed in the shape of a non-circular ring (or a circular ring) as if it surrounds (i.e. has an opening at a position overlapping) the pixel-electrode-side LDD region 1c (i.e. the second junction region as noted above) of the semiconductor layer 1a. In the illustrated exemplary configuration of FIGS. 4 and 5, the gate electrode 3a has the shape of a quadrangular ring in such a manner that it encloses the pixel-electrode-side LDD region 1c of the semiconductor layer 1a.

As shown in FIG. 7, which is a sectional view taken along the line VII-VII of FIG. 5, the gate electrode 3a is formed inside the open area 202h of the insulation film 202 in such a manner that the gate electrode 3a overlaps the channel region 1a' of the semiconductor layer 1a with a gate insulation film 2 being interposed therebetween. With such a layer structure, it is possible to perform control on an electric current that flows at the channel region 1a' of the semiconductor layer 1a by applying a gate voltage to the gate electrode 3a.

Referring back to FIGS. 4, 5, and 6, as has already been described above, the above-mentioned non-channel-region-overlapping portion of the gate electrode 3*a* has the shape of a ring as if it surrounds the pixel-electrode-side LDD region 1*c* of the semiconductor layer 1*a*. Such a ring-like structure of the gate electrode 3*a* is advantageous in that it is possible to shut off any incident light beam that enters through upper layers toward the pixel-electrode-side LDD region 1*c* of the semiconductor layer 1*a* at an oblique angle by means of the gate electrode 3*a*. More specifically, the pixel-electrode-side portion 31*a* of the gate electrode 3*a* that is formed opposite to the pixel-electrode-side source/drain region 1*e* of the semiconductor layer 1*a* can shut off, for example, an incident light beam that propagates toward the pixel-electrode-side LDD region 1*c* of the semiconductor layer 1*a* at an oblique angle along the direction shown by an arrow P1, which is shown in FIG. 6. In addition to the pixel-electrode-side portion 31*a* of the gate electrode 3*a* that is formed opposite to the pixel-electrode-side source/drain region 1*e* of the semiconductor layer 1*a* described above, the channel-region-overlapping portion of the gate electrode 3*a* that is formed opposite to the channel region 1*a*' of the semiconductor layer 1*a* can shut off incident light that propagates toward the pixel-electrode-side LDD region 1*c* of the semiconductor layer 1*a* at an oblique angle. Further in addition to the pixel-electrode-side portion 31*a* of the gate electrode 3*a* and the channel-region-overlapping portion thereof, each of side portions of the gate electrode 3*a* that are formed at the left and right of the pixel-electrode-side LDD region 1*c* of the semiconductor layer 1*a* can shut off incident light that propagates toward the pixel-electrode-side LDD region 1*c* of the semiconductor layer 1*a* at an oblique angle. On the condition that the gate electrode 3*a* fulfill its original function as a gate electrode, it is preferable that the gate electrode 3*a* should be formed as a layer having excellent light-shielding property, which features a high reflection factor or a high light absorption factor, though not limited thereto. As a non-limiting example thereof, it is preferable that the gate electrode 3*a* should be made of an opaque, that is, non-transparent single-layer film such as a polysilicon film, a metal film, or a metal silicide film, or a non-transparent multi-layer film that is formed as a lamination of, for example, a polysilicon film, a metal film, and/or a metal silicide film, though not limited thereto. Notwithstanding the above, however, the gate electrode 3*a* may be formed as a layer that does not have excellent light-shielding property. That is, as long as the gate electrode 3*a* has a unique shape and unique layout according to an aspect of the invention, an example of which is described and illustrated herein, and further as long as the material of the gate electrode 3*a* has some light-shielding property/capability such as light-reflecting property/capability or light-absorbing property/capability, regardless of whether it is excellent or not, it is possible to shut off any incident light beam that propagates toward the pixel-electrode-side LDD region 1*c* of the semiconductor layer 1*a* at an oblique angle by means of the gate electrode 3*a* having the unique shape and unique layout according to an aspect of the invention.

As in the configuration of the channel-region-overlapping portion of the gate electrode 3*a* that is formed opposite to the channel region 1*a*' of the semiconductor layer 1*a*, the pixel-electrode-side portion 31*a* of the gate electrode 3*a* is formed opposite to the pixel-electrode-side source/drain region 1*e* of the semiconductor layer 1*a* with the above-mentioned gate insulation film 2 being interposed therebetween. The pixel-electrode-side source/drain region 1*e* of the semiconductor layer 1*a* that is formed opposite to the pixel-electrode-side portion 31*a* of the gate electrode 3*a* is a heavily doped electro-conductive layer. Despite the fact that the pixel-electrode-side portion 31*a* of the gate electrode 3*a* is formed opposite to the pixel-electrode-side source/drain region 1*e* of the semiconductor layer 1*a*, there is no risk at all, or almost no risk or a very small risk in a practical sense, if any, that any electric field that is generated at the pixel-electrode-side portion 31*a* of the gate electrode 3*a* at the time of the operation of the TFT 30 adversely affects the semiconductor layer 1*a* thereof because the pixel-electrode-side source/drain region 1*e* of the semiconductor layer 1*a* is formed as a heavily doped electro-conductive layer. Since the semiconductor layer 1*a* thereof is free from such adverse electric effects caused by any electric field that is generated at the pixel-electrode-side portion 31*a* of the gate electrode 3*a* at the time of the operation of the TFT 30, it is possible to completely eliminate or substantially reduce the risk of the malfunction of the TFT 30. As illustrated in FIGS. 5 and 6, the pixel-electrode-side portion 31*a* of the gate electrode 3*a* is formed at a position that is distanced from the pixel-electrode-side LDD region 1*c* of the semiconductor layer 1*a* along the Y direction. The Y-directional distance is set at a value that is large enough so that it can effectively prevent any electric field that is generated at the pixel-electrode-side portion 31*a* of the gate electrode 3*a* at the time of the operation of the TFT 30 from adversely affecting the pixel-electrode-side LDD region 1*c* of the semiconductor layer 1*a*. By this means, in addition to the heavily doped configuration of the pixel-electrode-side source/drain region 1*e* of the semiconductor layer 1*a* described above, it is further possible to effectively prevent the malfunctioning operation of the TFT 30.

As illustrated in FIG. 5, a cross light-shielding region 99*cr* is formed at the intersection of the first light-shielding region 99*ba* of the non-open region 99*b* and the second light-shielding region 99*bb* thereof. As further illustrated therein, the pixel-electrode-side LDD region 1*c* of the semiconductor layer 1*a* is formed at the cross light-shielding region 99*cr* of the non-open region 99*b*. Incident light beams that come through upper layers that are formed above the pixel-electrode-side LDD region 1*c* of the semiconductor layer 1*a* toward the pixel-electrode-side LDD region 1*c* of the semiconductor layer 1*a* can be roughly classified into two groups, that is, X-directional propagation light and Y-directional propagation light. At the cross light-shielding region 99*cr* of the non-open region 99*b*, the first light-shielding region 99*ba* of the non-open region 99*b* shuts off the latter group of light that propagates, roughly speaking, in the Y direction, several examples of which are shown by arrows Py in FIG. 5. On the other hand, at the cross light-shielding region 99*cr* of the non-open region 99*b*, the second light-shielding region 99*bb* of the non-open region 99*b* shuts off the former group of light that propagates in the X direction in a rough sense, a few examples of which are shown by arrows Px in FIG. 5. It should be noted that each of the arrows Px shown in FIG. 5 is a non-limiting example of the propagation direction of X-directional light whereas each of the arrows Py shown therein is a non-limiting example of the propagation direction of Y-directional light.

Therefore, in the configuration of a liquid crystal device according to the present embodiment of the invention, the first light-shielding region 99*ba* of the non-open region 99*b* and the second light-shielding region 99*bb* thereof as well as the light-shielding gate electrode 3*a* shut off any light beam that propagates toward the pixel-electrode-side LDD region 1*c* of the semiconductor layer 1*a* at the cross light-shielding region 99*cr* of the non-open region 99*b*. Accordingly, despite the fact that the center region of the gate electrode 3*a* of each pixel of a liquid crystal device according to the present embodiment of the invention is formed as an open area that exposes the pixel-electrode-side LDD region 1c of the semiconductor layer 1a as viewed in a two-dimensional layout, the above-explained light-shielding structure makes it possible to effectively prevent any incident light beam that propagates toward the pixel-electrode-side LDD region 1c of the semiconductor layer 1a from reaching the pixel-electrode-side LDD region 1c of the semiconductor layer 1a.

The inventors of the subject application (i.e., present invention) empirically found that, at the time of operation of the TFT 30, an optical leakage current would be more likely to be generated thereat when light is irradiated to the pixel-electrode-side LDD region 1c than when light is irradiated to the data-line-side LDD region 1b. The reason why an optical leakage current would be more likely to be generated at the TFT 30 when light is irradiated to the pixel-electrode-side LDD region 1c than to the data-line-side LDD region 1b will be described in detail later. In this respect, if the configuration of a liquid crystal device according to the present embodiment of the invention is adopted, it is possible to enhance the light-shielding protection of the pixel-electrode-side LDD region 1c of the semiconductor layer 1a among all regions thereof. Or, in other words, it is possible to provide a "pinpoint-focused" light-shielding structure for the enhanced protection of the pixel-electrode-side LDD region 1c of the semiconductor layer 1a among all regions thereof. Therefore, it is possible to effectively reduce an optical leakage current that flows in the TFT 30 of each pixel.

In addition, if the configuration of a liquid crystal device according to the present embodiment of the invention is adopted, it is possible to provide a pinpoint light-shielding structure for the enhanced protection of the pixel-electrode-side LDD region 1c of the semiconductor layer 1a among all regions thereof without any need to provide an extra light-shielding region in addition to the cross light-shielding region 99cr of the non-open region 99b for the optical protection thereof. Therefore, such a pinpoint light-shielding structure for the enhanced protection of the pixel-electrode-side LDD region 1c of the semiconductor layer 1a among all regions thereof makes it possible to prevent the layout area of the non-open region 99b of each pixel from being wastefully and/or inefficiently wide, which inevitably results in the reduction in the area size of the open region 99a of each pixel. Since the unique light-shielding structure of a liquid crystal device according to the present embodiment of the invention makes it possible to avoid such reduction in the area size of the open region 99a of each pixel, it is possible to maintain a high numerical aperture even when the configuration of each pixel is made finer while providing pinpoint light-shielding effects for the enhanced protection of the pixel-electrode-side LDD region 1c of the semiconductor layer 1a among all regions thereof.

As explained above, in the configuration of a liquid crystal device according to the present embodiment of the invention, the gate electrode 3a has a ring-like shape. Having such a ring-like structure, the gate electrode 3a, together with other light-shielding components, makes it possible to effectively shut off any incident light beam that propagates toward the pixel-electrode-side LDD region 1c of the semiconductor layer 1a.

As illustrated in FIG. 6, the storage capacitor 70 is provided over the TFT 30, which is provided over the TFT array substrate 10, with a first inter-bedded insulation film (i.e., first interlayer insulation film) 41 being interposed between the storage capacitor 70 and the TFT 30.

The storage capacitor 70 consists of a lower capacitor electrode 71, an upper capacitor electrode 300, and a dielectric film 75, where the lower capacitor electrode 71 and the upper capacitor electrode 300 are opposed to each other with the dielectric film 75 being interposed therebetween.

The upper capacitor electrode (300) is formed as a part of the aforementioned capacitor line 300. The capacitor line 300 extends from the image display region 10a, at which the pixel electrodes 9a are provided, to the periphery thereof. The capacitor line 300 is electrically connected to a constant electric potential source. A detailed configuration of the capacitor line 300 is not illustrated in the drawing. The upper capacitor electrode 300, which is connected to the constant potential source via the capacitor line 300, functions as a fixed-electric-potential-side capacitor electrode (i.e., constant-potential-side capacitor electrode) that is maintained at a constant potential. The upper capacitor electrode 300, which is made of, for example, an opaque metal film containing a metal or an alloy such as Al (aluminum), Ag (silver), and the like, also functions as an upper light-shielding film (built-in light-shielding film) that shuts light off to protect the TFT 30. It should be noted that, in the configuration of a liquid crystal device according to the present embodiment of the invention, the upper capacitor electrode 300 may be made of an elemental metal, an alloy, a metal silicide, a polysilicide, or any lamination thereof, which contains at least one of a high melting point metal including but not limited to titanium (Ti), chromium (Cr), tungsten (W), tantalum (Ta), molybdenum (Mo), and palladium (Pd).

In FIG. 4 or FIG. 6, the lower capacitor electrode 71 is formed as a pixel-electric-potential-side capacitor electrode that is electrically connected to the pixel-electrode-side source/drain region 1e of the TFT 30 and the pixel electrode 9a. More specifically, the lower capacitor electrode 71 is electrically connected to the pixel-electrode-side source/drain region 1e via a contact hole 83 (refer to FIGS. 4 and 6); and in addition thereto, it is electrically connected to the relay layer 93 via a contact hole 84 (refer to FIGS. 4 and 8). The relay layer 93 is in turn electrically connected to the pixel electrode 9a via a contact hole 85 (refer to FIGS. 4 and 8). That is, functioning in combination with the relay layer 93, the lower capacitor electrode 71 offers a relay for electrical connection between the pixel-electrode-side source/drain region 1e and the pixel electrode 9a. The lower capacitor electrode 71 is made of, for example, conductive polysilicon. Or, as another example of the material thereof, the lower capacitor electrode 71 is made of an opaque metal film containing a metal such as Al (aluminum) or an alloy thereof, though not limited thereto.

In addition to its function as the pixel-electric-potential-side capacitor electrode, it is preferable that the lower capacitor electrode 71 should have a second function as a light absorption layer or a light-shielding film that is deposited between the upper capacitor electrode 300, which serves as the upper light-shielding film, and the TFT 30. Therefore, each of the upper capacitor electrode 300 and the lower capacitor electrode 71 offers additional light-shielding effects for shutting off an incident light beam that propagates through upper layers that are formed above the pixel-electrode-side LDD region 1c of the semiconductor layer 1a toward the pixel-electrode-side LDD region 1c of the semiconductor layer 1a at the cross light-shielding region 99cr of the non-open region 99b.

The dielectric film 75 has a monolithic structure or multi-tiered structure made of a silicon oxide film including but not limited to an HTO (High Temperature Oxide) film, an LTO (Low Temperature Oxide) film, or of a silicon nitride film, and the like.

As shown in FIGS. 6 and 8, the data line 6a and the relay layer 93 are provided over the storage capacitor 70 that is formed over the TFT array substrate 10 with the inter-bedded insulation film 42 being interposed between the storage capacitor 70 and the data line 6a/relay layer 93.

The data line 6a is electrically connected to the data-line-side source/drain region 1d of the semiconductor layer 1a via a contact hole 81, which penetrates through the insulation film 202, the inter-bedded insulation film 41, the dielectric film 75, and the inter-bedded insulation film 42. The data line 6a and the inner portion of the contact hole 81 are made of Al (aluminum)-containing material such as Al—Si—Cu, Al—Cu, etc., or aluminum only, or alternatively, a multilayer film that consists of an Al layer and a TiN layer, or the like. The data line 6a has an additional light-shielding function so as to protect the TFT 30.

As illustrated in FIG. 4 or FIG. 5, the data line 6a overlaps the gate electrode 3a in a plan view at the cross light-shielding region 99cr of the non-open region 99b. Therefore, the data line 6a offers additional light-shielding effects for shutting off an incident light beam that propagates through upper layers that are formed above the pixel-electrode-side LDD region 1c of the semiconductor layer 1a toward the pixel-electrode-side LDD region 1c of the semiconductor layer 1a at the cross light-shielding region 99cr of the non-open region 99b.

In FIGS. 4 and 8, the relay layer 93 is formed at the same layer as the data line 6a (refer to FIG. 6) on the inter-bedded insulation film 42. The data lines 6a and the relay layer 93 are formed by, firstly, depositing a thin film that is made of a conductive material such as a metal film on the second inter-bedded insulation film 42 by means of a thin film deposition technique, and then by partially removing the thin film (i.e., patterning) so as to separate the data lines 6a from the relay layer 93. Therefore, the manufacturing process of a liquid crystal device according to the present embodiment of the invention is simplified because the data line 6a and the relay layer 93 can be formed in the same single production step.

In FIGS. 6 and 8, the pixel electrode 9a is formed at a layer over the data line 6a with an inter-bedded insulation film 43 being interposed therebetween. The pixel electrode 9a is electrically connected to the pixel-electrode-side source/drain region 1e of the semiconductor layer 1a via the lower capacitor electrode 71, the contact holes 83, 84, and 85, and the relay layer 93. The contact hole 85 is formed by depositing a film of an electro-conductive material such as ITO that constitutes the pixel electrode 9a in the inner wall of a hole that is formed to penetrate through the third inter-bedded insulation film 43. The aforementioned alignment film 16 that is subjected to a predetermined orientation processing such as rubbing processing or the like is provided on the upper surface of the pixel electrodes 9a.

The structure described above is common to each of the pixel units (pixels) of a liquid crystal device according to the present embodiment of the invention. In the image display region 10a that is illustrated in FIG. 1, the pixel units are provided in a cyclic pattern.

A liquid crystal device according to the present embodiment of the invention, which has an exemplary configuration described above, makes it possible to prevent any image problem from arising due to the generation of an optical leakage current at the TFT 30 during the operation thereof, or makes it possible to substantially reduce it to a quite satisfactorily low or negligible level even when such an optical leakage current is generated slightly thereat so that no image problem will be visually perceived. In addition, a liquid crystal device according to the present embodiment of the invention makes it possible to achieve a fine pixel configuration without causing the poor operation of the TFT 30 and/or sacrificing (i.e., decreasing) the numerical aperture of each pixel. For this reason, a liquid crystal device according to the present embodiment of the invention, which has an exemplary configuration described above, makes it possible to display images with high quality.

With reference to FIGS. 9-14, in the following description, the reason why there is a relatively greater possibility of the generation of an optical leakage current in the pixel-electrode-side LDD region 1c than in the data-line-side LDD region 1b at the time of operation of the TFT 30 described above is explained in detail.

Figure 9:
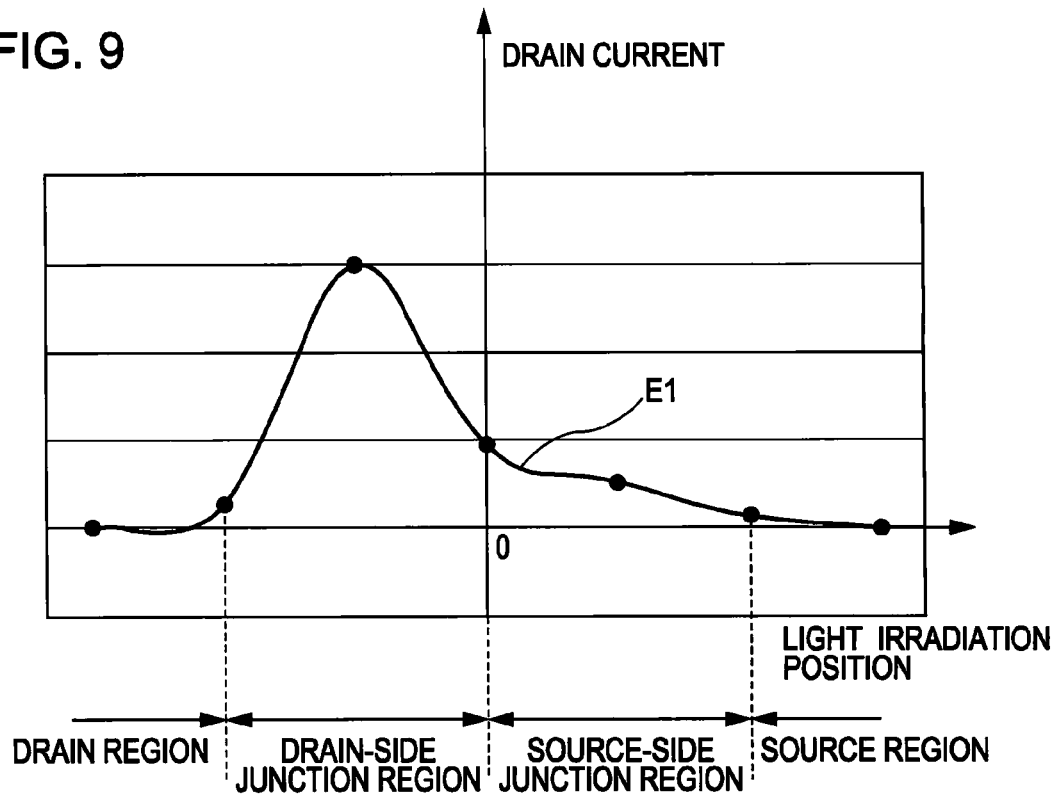
FIG. 9 is a graph that shows the relationship between the light irradiation position in the test TFT and the drain current level.

Firstly, with reference to FIG. 9, an explanation is given on the result of measurement of a drain current level when light is irradiated to a test TFT. FIG. 9 is a graph that shows the relationship between the light irradiation position in the test TFT and the drain current level.

In FIG. 9, data E1 denotes the measurement result of the level of a drain current when an optical spot (a visible light laser of approximately 2.4 μm) is irradiated to a test element TFT, that is, TEG (Test Element Group), scanning sequentially from the drain region side to the source region side. In addition to a channel region, a source region, and a drain region, the TEG has a source-side junction region that is formed at a junction portion between the channel region and the source region, and a drain-side junction region that is formed at a junction portion between the channel region and the drain region.

The horizontal axis of FIG. 9 represents a light irradiation position at which the optical spot is irradiated. In the figure, the boundary between the channel region and the drain-side junction region, the boundary between the channel region and the source-side junction region, and the channel region are defined as zero. The vertical axis of FIG. 9 represents the level of a drain current (a relative value normalized by a predetermined value). It shows a positive value (plus) when a drain current flows from the drain region to the source region, whereas it shows a negative value (minus) when the drain current flows from the source region to the drain region.

In FIG. 9, the data E1 shows a positive value at every light irradiation position. That is, it shows that the drain current flows from the drain region to the source region. In addition, the data E1 indicates greater values in the drain-side junction region than in the source-side junction region. In other words, it shows that a relatively larger drain current flows when an optical spot is irradiated in the drain-side junction region than in the source-side junction region. This means that a relatively larger optical leakage current flows when the optical spot is irradiated in the drain-side junction region than in the source-side junction region. It should be noted that a drain current consists of a dark current (or a sub-threshold leakage current, that is, a leakage current that flows between the source region and the drain region when the TEG is in an OFF state even under conditions where light is not irradiated) and an optical leakage current (or an optical-beam-induced current, that is, a current that is generated due to the excitation of electrons caused by irradiation of light).

Figure 10:
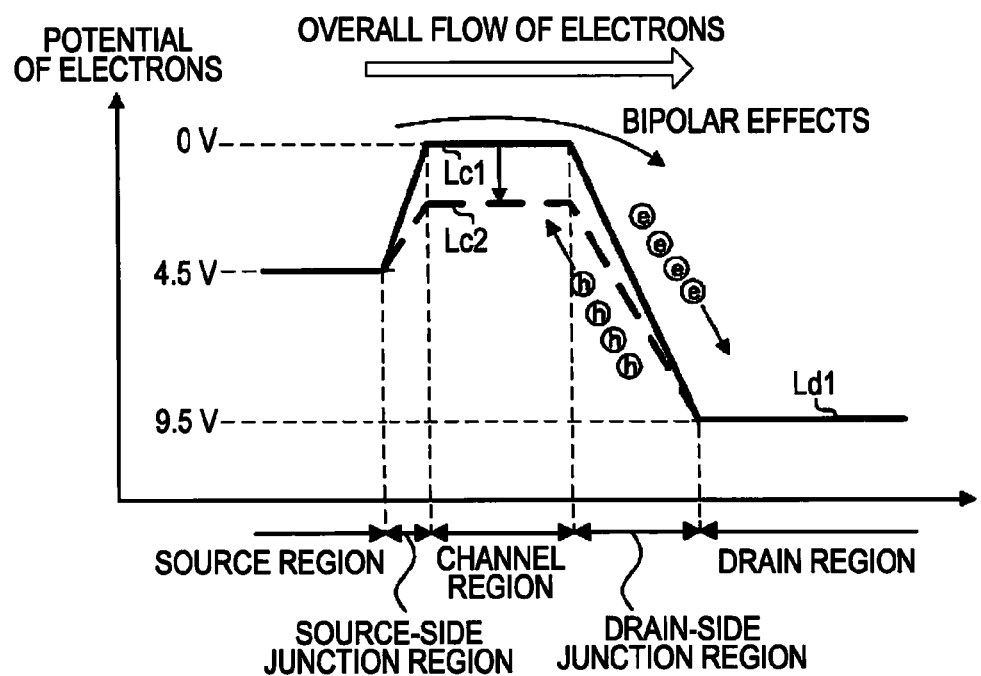
FIG. 10 is a conceptual diagram that illustrates the behavior of a carrier when light excitation occurs in a drain-side junction region.
Figure 11:
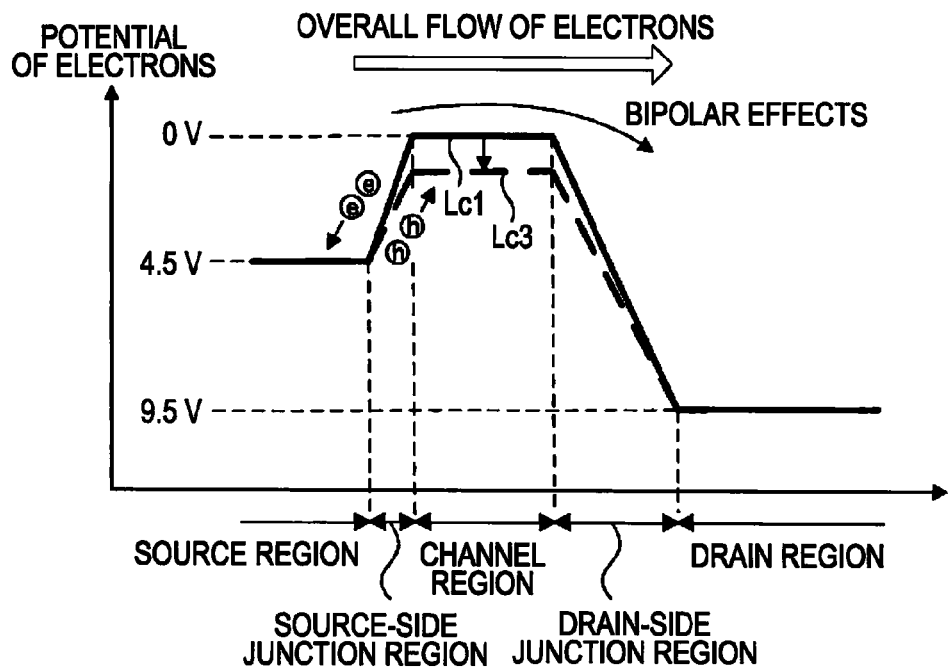
FIG. 11 is a conceptual diagram that illustrates the behavior of a carrier when light excitation occurs in a source-side junction region.

Next, with reference to FIGS. 10 and 11, an explanation is given to clarify a mechanism that a relatively larger optical leakage current flows when an optical spot is irradiated in the drain-side junction region than when it is irradiated in the source-side junction region. FIG. 10 is a conceptual diagram that illustrates the behavior of a carrier when light excitation occurs in the drain-side junction region. FIG. 11 is a conceptual diagram that illustrates the behavior of a carrier when light excitation occurs in the source-side junction region. In FIGS. 10 and 11, halftone display is assumed in the pixel electrode 9a to which the above-described TFT 30 is electrically connected. Accordingly, the source electric potential (i.e., the electric potential of the source region) is 4.5V. The gate electric potential (i.e., the electric potential of the channel region) is 0V. The drain electric potential (i.e., the electric potential of the drain region) is 9.5V. The horizontal axis in FIGS. 10 and 11 represents each of the regions in the semiconductor layer that constitutes the TEG. The vertical axis in FIGS. 10 and 11 represents the potential of electrons (Fermi level). Because the electron has a negative electric charge, the potential of an electron becomes lower as the electric potential in each region becomes higher, whereas the potential of an electron becomes higher as the electric potential in each region becomes lower.

FIG. 10 illustrates the behavior of a carrier when an optical spot is irradiated in the drain-side junction region that is formed between the channel region and the drain region to cause light excitation in the drain-side junction region.

In FIG. 10, it is presumed that an optical leakage current consists of two current components.

A first current component is a current component generated by the move of electrons that are caused by light excitation. More specifically, the first current component is a current component generated by the move of electrons that are caused by light excitation in the drain-side junction region (denoted as "e" in the figure) from the drain-side junction region to the drain region, which has a lower potential (this current component flows from the drain region to the source region).

A second current component is a current component generated by the move of holes (that is, positive holes denoted as "h" in the figure) that are caused/generated due to light excitation. More specifically, the second current component is a current component attributable to bipolar effects, which is caused by the move of holes that are generated by light excitation in the drain-side junction region from the drain-side junction region to the channel region, which has a lower potential (that is, higher in electron potential). That is, the second one is a current component due to an increase in electrons moving from the source region to the drain region (this current component flows from the drain region to the source region) because the potential of the channel region (that is, so-called base potential) is lowered from a potential Lc1 to a potential Lc2 due to the positive electric charge of holes that have moved to the channel region. Thus, when light excitation occurs in the drain-side junction region, both of the first current component and the second current component are generated to flow in a direction that increases a drain current (or in other words, a collector current) (that is, in a direction from the drain region to the source region).

FIG. 11 illustrates the behavior of a carrier when an optical spot is irradiated in the source-side junction region that is formed between the channel region and the source region to cause light excitation in the source-side junction region.

In FIG. 11, unlike the above-described case, which is explained with reference to FIG. 10, where light excitation occurs in the drain-side junction region, it is presumed that the second current component attributable bipolar effects caused by the move of holes from the source-side junction region to the channel region, which has a lower potential (that is, higher in electron potential), is dominant. That is, it is presumed that the first current component, which is generated due to the move of electrons generated by light excitation in the source-side junction region (denoted as "e" in the figure) from the source-side junction region to the source region, which has a lower potential (this current component flows from the source region to the drain region), is less than the second current component attributable to bipolar effects (this current component flows from the drain region to the source region).

In FIG. 11, the second current component attributable to bipolar effects (that is, a current component due to an increase in electrons moving from the source region to the drain region because the base potential is lowered from the potential Lc1 to a potential Lc3 due to the positive electric charge of holes that have moved to the channel region) flows from the drain region to the source region. On the other hand, the above-described first current component flows from the source region to the drain region. That is, the first current component and the second current component flow in directions opposite to each other. Referring back to FIG. 9, the drain current level (refer to the data E1) indicates a positive value when an optical spot is irradiated in the source-side junction region. That is, in this case, a drain current flows from the drain region to the source region. Thus, it would be safe to say that the first current component merely suppresses a current component due to a dark current and/or a current component due to bipolar effects, which is a second current component, but it is not significantly large enough to cause a drain current to flow from the source region to the drain region.

In addition, because the electric potential difference between the channel region and the source region is smaller than the electric potential difference between the channel region and the drain region, the depletion region at the source-region side (that is, the source-side junction region) is narrower than the depletion region at the drain-region side (that is, the drain-side junction region). For this reason, the absolute amount of light excitation when an optical spot is irradiated in the source-side junction region is less than a case where the optical spot is irradiated in the drain-side junction region.

As described above with reference to FIGS. 10 and 11, both of the first current component and the second current component are generated to flow in a direction that increases a drain current when light excitation occurs in the drain-side junction region. On the other hand, when light excitation occurs in the source-side junction region, the first current component suppresses the second current component. Thus, a relatively larger drain current flows when an optical spot is irradiated in the drain-side junction region than in the source-side junction region (that is, a relatively larger optical leakage current flows).

Figure 12:
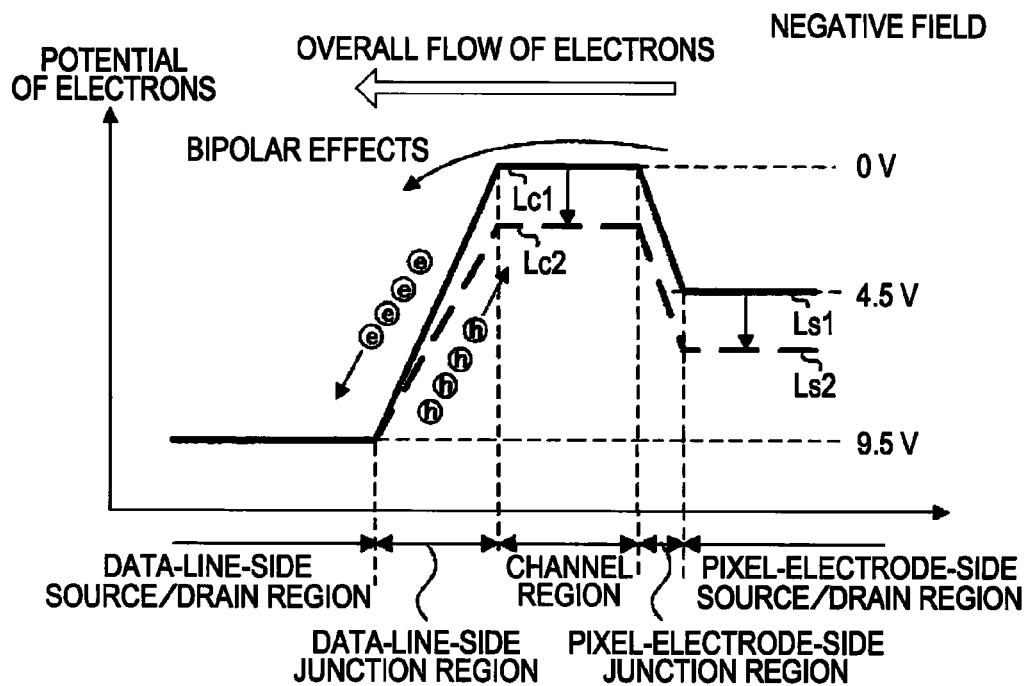
FIG. 12 is a conceptual diagram that illustrates the behavior of a carrier when light excitation occurs in a data-line-side junction region (or in other words, the drain-side junction region) in a case where the data-line-side source/drain region is set at a drain electric potential.
Figure 13:
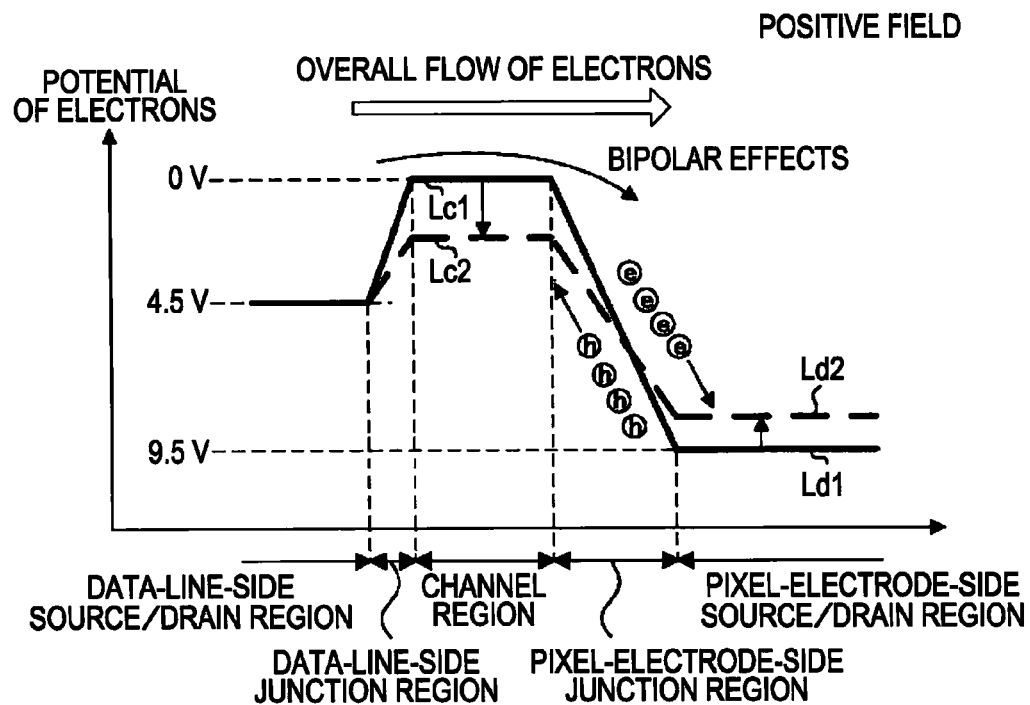
FIG. 13 is a conceptual diagram that illustrates the behavior of a carrier when light excitation occurs in a pixel-electrode-side junction region (or in other words, the drain-side junction region) in a case where the pixel-electrode-side source/drain region is set at a drain electric potential.

Next, with reference to FIGS. 12 and 13, an explanation is given to clarify a mechanism that a relatively larger optical leakage current flows when the pixel-electrode-side source/drain region is set at a drain electric potential and an optical spot is irradiated in the pixel-electrode-side junction region in comparison with when the data-line-side source/drain region is set at a drain electric potential and an optical spot is irradiated in the data-line-side junction region. FIG. 12 is a conceptual diagram that illustrates the behavior of a carrier when light excitation occurs in the data-line-side junction region (or in other words, the drain-side junction region) in a case where the data-line-side source/drain region is set at a drain electric potential. FIG. 13 is a conceptual diagram that illustrates the behavior of a carrier when light excitation occurs in the pixel-electrode-side junction region (or in other words, the drain-side junction region) in a case where the pixel-electrode-side source/drain region is set at a drain electric potential.

In the following description, it is assumed that electric charge is held at the pixel portion (i.e., pixel unit, or pixel) containing the pixel-switching TFT and further assumed that light excitation occurs thereat. The point of difference from the above-described case where the TEG is assumed is that the pixel-electrode side of the TFT for pixel switching could be in a floating state. In some cases, a hold capacitor such as the storage capacitor 70 is connected to the pixel-electrode side of the TFT for pixel switching. If the capacitance value is sufficiently large, the pixel-electrode side of the TFT for pixel switching will be in a state similar to a fixed electrode, which is the same as when the above-described TEG is used. However, if the capacitance value is not sufficiently large, the pixel-electrode side of the TFT for pixel switching will be in a floating state or a state similar thereto. In the discussion herein, it is assumed that the capacitance value is not sufficiently large.

In FIGS. 12 and 13, an alternating current driving method is adopted in a liquid crystal device so as to prevent a so-called burn-in phenomenon. Herein, under the assumption of half-tone display, it is further assumed that electric charge of 4.5V negative field and electric charge of 9.5V positive field are held in an alternating manner at the pixel electrode with the reference electric potential being 7V. Accordingly, the source and the drain of the TFT for pixel switching are not fixed but varied between the pixel-electrode-side source/drain region and the data-line-side source/drain region. That is, as illustrated in FIG. 12, the pixel-electrode-side source/drain region functions as a source when the negative field electric charge is held at the pixel electrode (that is, when the electric potential of the pixel-electrode-side source/drain region is lower than the electric potential of the data-line-side source/drain region). In contrast, as illustrated in FIG. 13, the pixel-electrode-side source/drain region functions as a drain when the positive field electric charge is held at the pixel electrode (that is, when the electric potential of the pixel-electrode-side source/drain region is higher than the electric potential of the data-line-side source/drain region).

In FIG. 12, the pixel-electrode-side source/drain region functions as a source (or an emitter) whereas the data-line-side source/drain region functions as a drain (or a collector) when the negative field electric charge is held at the pixel electrode. Upon the occurrence of light excitation at the data-line-side junction region, which is the drain-side junction region, as has already been described above, the first current component, which is generated by the move of electrons that are generated by light excitation, and the second current component, which is attributable to bipolar effects, are generated. When the second current component attributable to bipolar effects is generated (that is, when the base potential is lowered from the potential Lc1 to the potential Lc2 so that electrons move from the pixel-electrode-side source/drain region, which functions as the source, to the data-line-side source/drain region, which functions as the drain), the electrons flows out of the pixel-electrode-side source/drain region, which is in a floating state; and therefore, the potential of the pixel-electrode-side source/drain region functioning as the emitter is lowered from the potential Ls1 to the potential Ls2 (the electric potential is raised). That is, when light excitation occurs at the data-line-side junction region, which is the drain-side junction region, the base potential decreases; and in addition thereto, the potential of the pixel-electrode-side source/drain region also decreases. In other words, when light excitation occurs at the data-line-side junction region, which is the drain-side junction region, the emitter electric potential increases as the base electric potential increases. For this reason, the drain current (i.e., collector current) is suppressed.

On the other hand, in FIG. 13, the data-line-side source/drain region functions as the source (or the emitter) whereas the pixel-electrode-side source/drain region functions as the drain (or the collector) when the positive field electric charge is held at the pixel electrode. Upon the occurrence of light excitation at the pixel-electrode-side junction region, which is the drain-side junction region, as has already been described above, the first current component, which is generated by the move of electrons that are generated by light excitation, and the second current component, which is attributable to bipolar effects, are generated. Unlike the pixel electrode, because the data-line-side source/drain region, which functions as the source, is connected to the data lines, the data-line-side source/drain region is not in a floating state; and therefore, the electric potential does not change. When the second current component attributable to bipolar effects is generated (that is, when the base potential is lowered from the potential Lc1 to the potential Lc2 so that electrons move from the data-line-side source/drain region, which functions as the source, to the pixel-electrode-side source/drain region, which functions as the drain), the electrons flows into the pixel-electrode-side source/drain region, which is in a floating state; and therefore, the potential of the pixel-electrode-side source/drain region functioning as the collector is raised from the potential Ld1 to the potential Ld2 (the electric potential is lowered) Unlike the decrease in the potential of the pixel-electrode-side source/drain region functioning as the source described above, however, the increase in the potential of the pixel-electrode-side source/drain region functioning as the collector has almost no effects on the suppression of the drain current. Because the drain current (i.e., collector current) is predominantly determined by the level of the base electric potential with respect to the emitter electric potential, even when the collector electric potential decreases, there occurs almost no effects on the suppression of the drain current. In other words, it enters into a saturation region of the bipolar transistor.

As explained above with reference to FIGS. 12 and 13, there occurs almost no suppression of the second current component attributable to bipolar effects when the positive field electric charge is held at the pixel electrode (that is, when the pixel-electrode-side source/drain region functions as the drain), whereas, in contrast thereto, the second current component attributable to bipolar effects is suppressed because of the increase in the electric potential of the pixel-electrode-side source/drain region, which is in a floating state, when the negative field electric charge is held at the pixel electrode (that is, when the data-line-side source/drain region functions as the drain). That is, the drain current increases because of the optical leakage current when the pixel-electrode-side source/drain region functions as the drain in comparison with when the data-line-side source/drain region functions as the drain.

Figure 14:
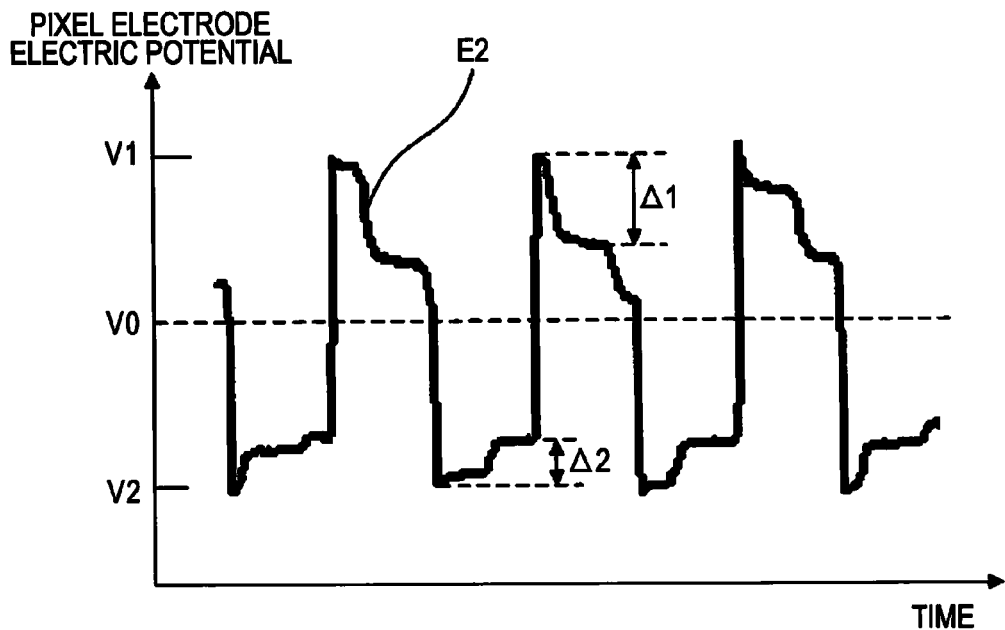
FIG. 14 illustrates the waveform of a pixel electrode electric potential when a relatively intense light beam is irradiated on the entirety of the TFT for pixel switching.

FIG. 14 illustrates the waveform of the pixel electrode electric potential when a relatively intense light beam is irradiated on the entirety of the TFT for pixel switching.

In FIG. 14, the data E2 shows that the fluctuation Δ1 of the pixel electrode electric potential when the positive field electric charge is held at the pixel electrode (that is, when the pixel electrode electric potential is at the electric potential (voltage) V1) is larger than the fluctuation Δ2 of the pixel electrode electric potential when the negative field electric charge is held at the pixel electrode (that is, when the pixel electrode electric potential is at the electric potential V2). That is, it shows that the positive field electric charge has a lesser tendency to be held (i.e., more susceptible to the generation of the optical leakage current) in comparison with the negative field electric charge. This observation agrees with the mechanism described above, that is, the optical leakage current would be more likely to be generated when the positive field electric charge is held at the pixel electrode (that is, the pixel-electrode-side source/drain region functions as the drain) than when the negative field electric charge is held at the pixel electrode (that is, the data-line-side source/drain region functions as the drain).

As described in detail above with reference to FIGS. 9-14, the drain current has a tendency to increase when light excitation occurs in the drain-side junction region of the TFT for pixel switching. In addition, the drain current has a tendency to increase when the pixel-electrode-side source/drain region functions as the drain (conversely, current component attributable to bipolar effects is suppressed when the data-line-side source/drain region functions as the drain). Therefore, as the liquid crystal device according to this embodiment of the invention proposes, it is possible to quite effectively reduce the occurrence of an optical leakage current in the TFT 30 without sacrificing a high opening ratio (i.e., numerical aperture), which is achieved by enhancing the light-shielding property to protect the pixel-electrode-side LDD region 1c, which is the pixel-electrode-side junction region, at a higher light-protection level than the data-line-side LDD region 1b, which is the data-line-side junction region.

Second Embodiment

Figure 15:
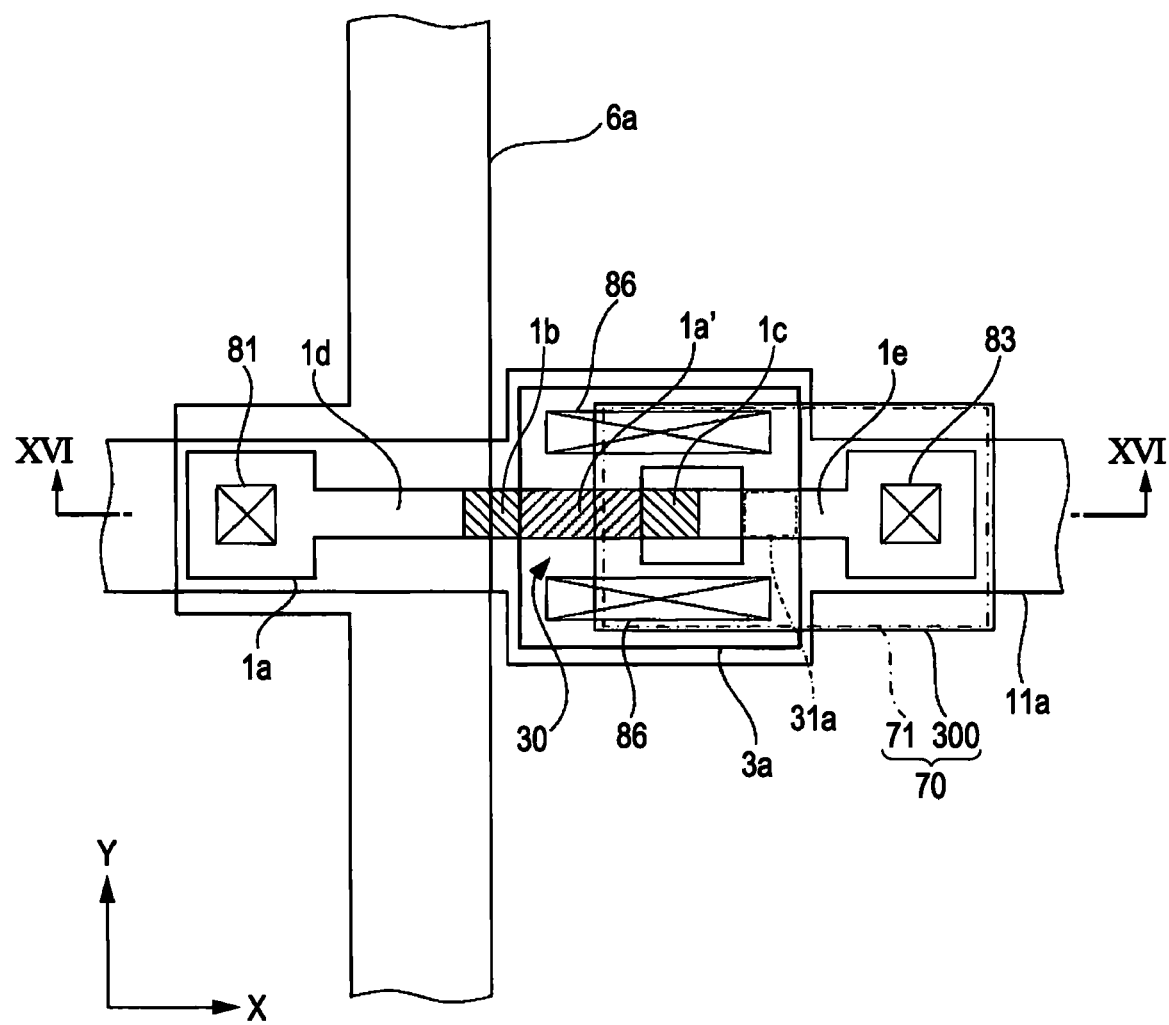
FIG. 15 is a partial plan view that schematically illustrates an example of the partial configuration of the pixel unit of a liquid crystal device according to a second exemplary embodiment of the invention, or more specifically, a transistor and other components thereof.
Figure 16:
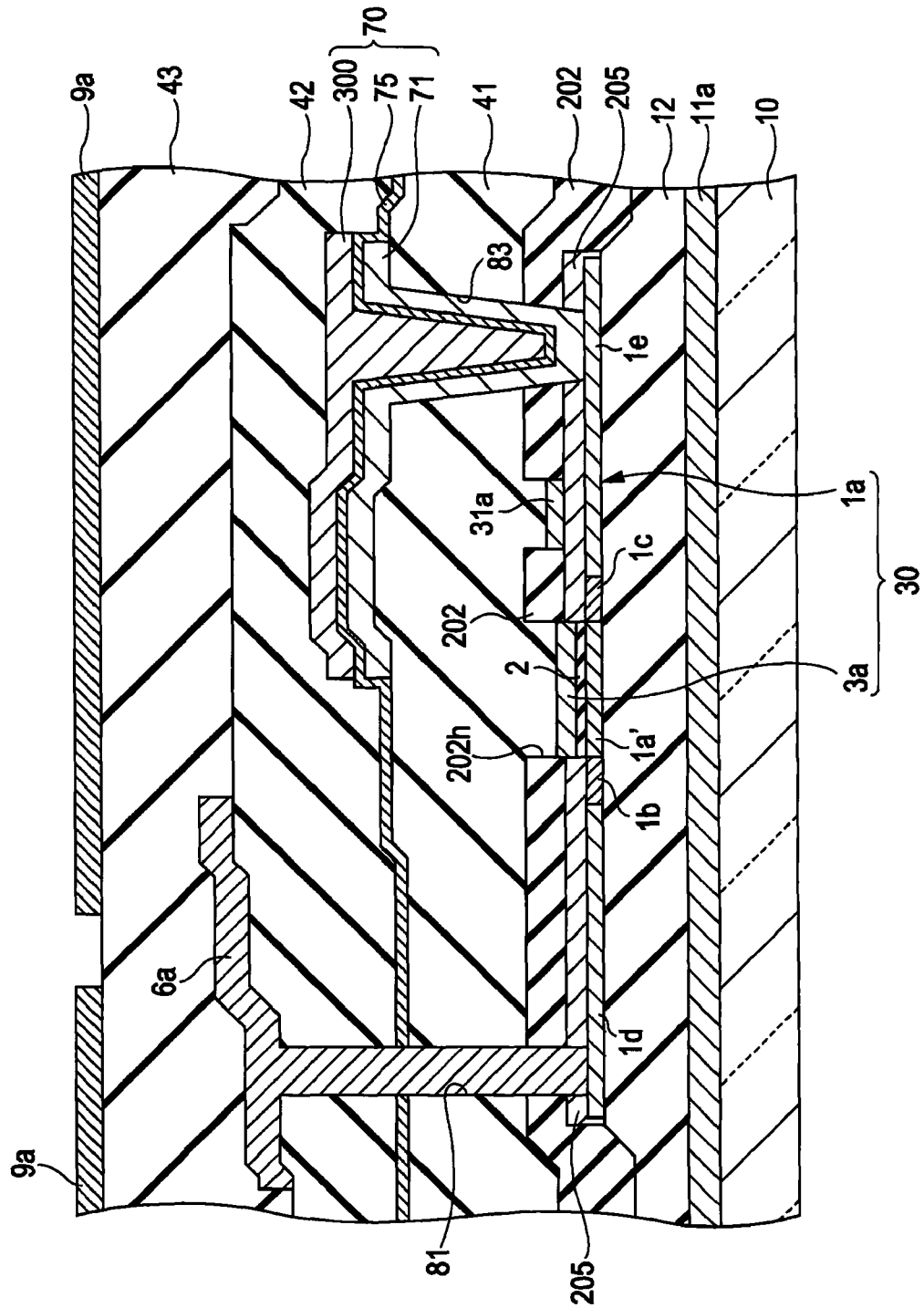
FIG. 16 is a sectional view taken along the line XVI-XVI of FIG. 15.

Next, with reference to FIGS. 15 and 16, a liquid crystal device according to a second exemplary embodiment of the invention is explained below. FIG. 15 is a partial plan view that schematically illustrates an example of the partial configuration of the pixel unit of a liquid crystal device according to the second exemplary embodiment of the invention, or more specifically, a transistor and other components thereof. FIG. 16 is a sectional view taken along the line XVI-XVI of FIG. 15. In FIGS. 15 and 16, the same reference numerals are assigned to the same components as those of the pixel unit of a liquid crystal device according to the foregoing first exemplary embodiment of the invention. Except that the configuration of the transistor 30 according to the second embodiment of the invention is fundamentally different from the configuration of the transistor (such as TFT, though not limited thereto) 30 according to the first embodiment of the invention, the configuration of the pixel unit of a liquid crystal device according to the second embodiment of the invention described below is fundamentally the same as the configuration of the pixel unit of a liquid crystal device according to the first embodiment of the invention described above. Accordingly, in the following description, an explanation is given with a focus on the differentiating and characteristic features of the transistor 30 according to the second embodiment of the invention. Note that a detailed explanation of other configuration of a liquid crystal device according to the second embodiment of the invention may be omitted or simplified in order to avoid redundancy as long as the understanding of the unique features of this aspect of the invention is not impaired.

In contrast to the vertical region array configuration of the transistor 30 of a liquid crystal device according to the foregoing first embodiment of the invention, as illustrated in FIG. 15, the transistor 30 of a liquid crystal device according to the second embodiment of the invention is configured (i.e., formed) as a horizontal transistor that has functional regions arrayed in a horizontal direction. That is, the transistor 30 according to the second embodiment of the invention has the semiconductor layer 1a that extends not along the data line 6a but along the scanning line 11a. Or, in other words, in the configuration of the transistor 30 according to the second embodiment of the invention as viewed in two dimensions, the semiconductor layer 1a thereof extends not in the Y direction but in the X direction as illustrated therein.

In addition, in the configuration of the transistor 30 according to the second embodiment of the invention as viewed in cross section, the scanning line 11a is formed between the TFT array substrate 10 and the underlying insulation film 12. The scanning line 11a has light-shielding property. Accordingly, the scanning line 11a has, in addition to its original function, the same function as the lower light-shielding film 110 according to the first embodiment of the invention described above. Specifically, the scanning line 11a makes it possible to shut off light (return light) that propagates toward the TFT 30 from the TFT array substrate (10) side. For example, thanks to the presence of the scanning line 11a, it is possible to shut off, though not limited thereto, light attributable to backside reflection at the TFT array substrate 10, or light that is emitted from other liquid crystal device such as a multiple-plate type projector, or the like, to penetrate through a composite optical system, thereby effectively protecting the TFT 30.

In the illustrated exemplary configuration of the transistor 30 according to the present embodiment of the invention, a pair of elongated contact holes 86 is formed along the elongated semiconductor layer 1a. One of the pair of elongated contact holes 86 is formed adjacent to one elongated side of the semiconductor layer 1a, whereas the other of the pair of elongated contact holes 86 is formed adjacent to the other elongated side thereof. Through these contact holes 86, the scanning line 11a is electrically connected to the gate electrode 3a, which is provided at a layer over the semiconductor layer 1a. With such an electric connection, it is possible to transfer a scanning signal to the gate electrode 3a so as to ensure the reliable operation of the transistor 30.

As illustrated in FIG. 16, a protection film 205 is deposited on the semiconductor layer 1a. The protection film 205 prevents a layer(s) that is formed under the protection film 205 from being damaged at the time when a layer(s) that is formed over the protection film 205 is etched away, removed, or treated in other similar or alternative way. In the illustrated exemplary configuration of the transistor 30 according to the present embodiment of the invention, for example, the protection film 205 prevents the semiconductor layer 1a that is formed immediately under the protection film 205 from being damaged at the time when the insulation film 202 that is formed immediately over the protection film 205 is etched away, removed, or treated in other similar or alternative way.

A partial region of the protection film 205 at which the channel region 1a' and the gate electrode 3a are formed opposite to each other is etched away or removed by means of other similar or alternative technique. The gate insulation film 2 is formed at the partially removed region of the protection film 205. The channel-region-overlapping portion of the gate electrode 3a that is formed opposite to the channel region 1a' of the semiconductor layer 1a is formed as the same layer as the pixel-electrode-side portion 31a of the gate electrode 3a. However, it should be particularly noted that the channel-region-overlapping portion of the gate electrode 3a that is formed opposite to the channel region 1a' of the semiconductor layer 1a is formed at a level (i.e., height) that differs from the level at which the pixel-electrode-side portion 31a of the gate electrode 3a is formed as viewed in a vertical orientation that is perpendicular to the surface of the TFT array substrate 10. Specifically, the pixel-electrode-side portion 31a of the gate electrode 3a is formed at a layer position that is higher than the layer position of the channel-region-overlapping portion of the gate electrode 3a that is formed opposite to the channel region 1a' of the semiconductor layer 1a by a level difference that is equal to a difference in film thickness between the gate insulation film 2 and the protection film 205.

As explained above, in the configuration of the transistor 30 according to the second embodiment of the invention, the pixel-electrode-side portion 31a of the gate electrode 3a is formed at a height (i.e., level) that differs from the height at which the channel-region-overlapping portion of the gate electrode 3a, which is formed opposite to the channel region 1a' of the semiconductor layer 1a, is formed as viewed in a vertical direction that is orthogonal to the TFT array substrate 10. With such a layer structure, a liquid crystal device according to the present embodiment of the invention makes it possible to shut off incident light beams that enter/propagate at variant angles. In the above description of the second embodiment of the invention, it is explained that the pixel-electrode-side portion 31a of the gate electrode 3a is formed at a level that is different from the level of the channel-region-overlapping portion of the gate electrode 3a that is formed opposite to the channel region 1a' of the semiconductor layer 1a by a level difference that is equal to a difference in thickness between films formed under the gate electrode 3a. However, the scope of this aspect of the invention is not limited to such an exemplary configuration. For example, in place of providing a film-thickness difference between under-layer films, it is possible to form the pixel-electrode-side portion 31a of the gate electrode 3a at a level that is different from the level of the channel-region-overlapping portion of the gate electrode 3a that is formed opposite to the channel region 1a' of the semiconductor layer 1a by making the number of under-layer film(s) that is/are formed under the pixel-electrode-side portion 31a of the gate electrode 3a different from the number of under-layer film(s) that is/are formed under the channel-region-overlapping portion of the gate electrode 3a that is formed opposite to the channel region 1a' of the semiconductor layer 1a. For example, a plurality of insulation films or the like may be formed between the semiconductor layer 1a and the pixel-electrode-side portion 31a of the gate electrode 3a.

As illustrated in FIG. 15, the gate electrode 3a has a ring-like shape. With the unique shape and unique layout thereof according to an aspect of the invention, a liquid crystal device according to the second embodiment of the invention, which has, in each pixel unit thereof, a horizontal transistor that has functional regions arrayed in a horizontal direction, offers the same advantageous effects as those offered by a liquid crystal device according to the foregoing first embodiment of the invention.

Electronic Apparatus

Figure 17:
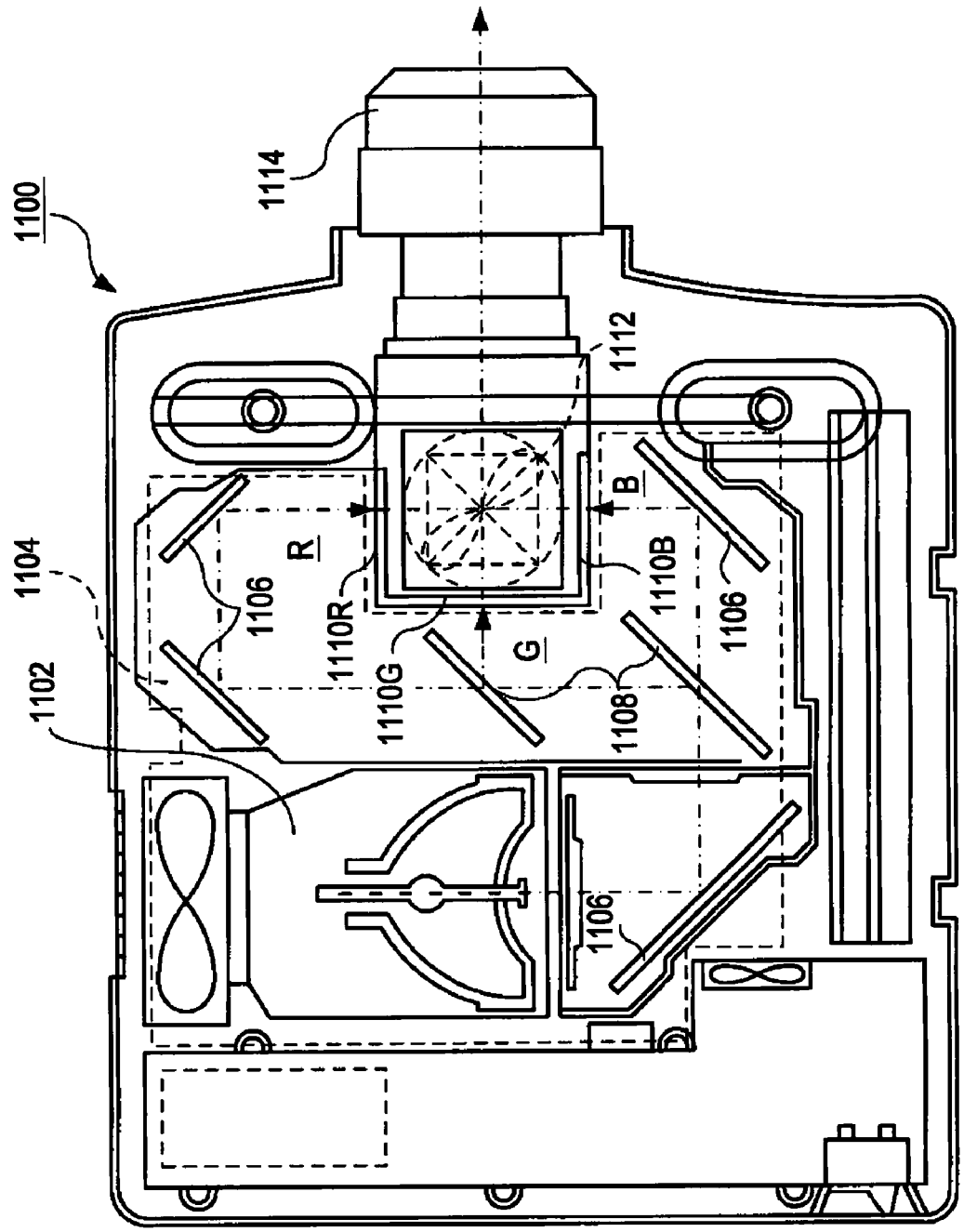
FIG. 17 is a plan view that schematically illustrates an example of the configuration of a projector, which is an example of electronic apparatuses to which an electro-optical device according to an aspect of the invention is applied.

Next, an explanation is given on the application of the above-described liquid crystal device, which is an example of an electro-optical device, to various kinds of electronic apparatuses. FIG. 17 is a plan view that schematically illustrates an example of the configuration of a projector. In the following description, an explanation is given of a projector that employs the above-described liquid crystal device as a light valve.

As illustrated in FIG. 17, a lamp unit 1102, which is made of a white light source such as a halogen lamp, is provided in a projector 1100. A projection light beam that is emitted from the lamp unit 1102 is separated into three primary color components of R, G, and B by four mirrors 1106 and two dichroic mirrors 1108 arranged in a light guide 1104. The separated primary color components of R, G, and B enter liquid crystal panel 1110R, 1110B, and 1110G, respectively, which function as light valves corresponding to the respective primary color components.

The configuration of the liquid crystal panel 1110R, 110G, or 1110B is the same as or similar to that of the liquid crystal device described above. Each of these liquid crystal panels 1110R, 1110G, and 1110B is driven by the corresponding one of the primary color signals R, G, and B, which are supplied from an image signal processing circuit. Light subjected to optical modulation by one of these liquid crystal panels enters a dichroic prism 1112 from the corresponding one of three directions. Light of R color component and light of B color component are refracted at a 90-degree angle at the dichroic prism 1112, whereas light of G color component goes straight through the dichroic prism 1112. Therefore, as a result of combination of these color components, a color image is projected on a screen, etc., through a projection lens 1114.

Focusing attention on a display image offered by each of the liquid crystal panels 1110R, 1110G, and 1110B, it is necessary to reverse the display image of the liquid crystal panel 1110G in a mirror pattern (that is, to reverse the left side and the right side) with respect to the display images of the liquid crystal panels 1110R and 1110B.

Because light corresponding to each one of the primary colors R, G, and B enters into the corresponding one of the liquid crystal panel 1110R, 1110G, and 1110B thanks to the presence of the dichroic mirror 1108, it is not necessary to provide a color filter thereon.

Among a variety of electronic apparatuses to which the electro-optical device according to an aspect the invention could be embodied are, in addition to the electronic apparatus (projector) explained above with reference to FIG. 17, a mobile-type personal computer, a mobile phone, a liquid crystal display television, a viewfinder-type video recorder, a video recorder of a direct monitor view type, a car navigation device, a pager, an electronic personal organizer, an electronic calculator, a word processor, a workstation, a videophone, a POS terminal, a touch-panel device, and so forth. Needless to say, the invention is also applicable to these various electronic apparatuses without any limitation to those mentioned above.

In addition to the liquid crystal device explained in the exemplary embodiments described above, the invention is also applicable to a reflective liquid crystal display which has elements formed on a silicon substrate (LCOS, liquid crystal on silicon), a plasma display (PDP), a field emission display (FED), a surface-conduction electron-emitter display (SED), an organic EL display, a digital micro mirror device (DMD), an electrophoresis apparatus, to name but a few.

The present invention should be in no case interpreted to be limited to the specific embodiments described above. The invention may be modified, altered, changed, adapted, and/or improved within a range not departing from the gist and/or spirit of the invention apprehended by a person skilled in the art from explicit and implicit description given herein as well as appended claims. An electro-optical device subjected to such a modification, alteration, change, adaptation, and/or improvement and an electronic apparatus that is provided with such an electro-optical device are also within the technical scope of the invention.

What is claimed is:

1. An electro-optical device comprising:
   a data line and a scanning line extending so as to intersect each other;
   a pixel electrode in a pixel at a position corresponding to an intersection of the data line and the scanning line; and
   a switching element including:
      a semiconductor layer including:
         a channel region with a channel length along a direction in which either the data line or the scanning line extends;
         a data-line-side source/drain region that is electrically connected to the data line;

a pixel-electrode-side source/drain region that is electrically connected to the pixel electrode;

a first junction region that is formed between the channel region and the data-line-side source/drain region; and a second junction region that is formed between the channel region and the pixel-electrode-side source/drain region; and a gate electrode provided opposite to the channel region, the gate electrode overlapping the pixel-electrode-side source/drain region and having a ring-shaped structure that surrounds an opening at a position overlapping the second junction region;

wherein the second junction region of the semiconductor layer of the switching element is an LDD region and the pixel-electrode-side source/drain region of the semiconductor layer of the switching element is a heavily doped region.

2. The electro-optical device according to claim 1, wherein the gate electrode of the switching element is provided opposite to the pixel-electrode-side source/drain region of the semiconductor layer thereof with an interlayer insulation film being interposed between the gate electrode of the switching element and the pixel-electrode-side source/drain region of the semiconductor layer thereof; and the interlayer insulation film that is interposed between the gate electrode of the switching element and the pixel-electrode-side source/drain region of the semiconductor layer thereof is formed as the same layer as the gate insulation film.

3. The electro-optical device according to claim 1, wherein the gate electrode of the switching element is provided opposite to the pixel-electrode-side source/drain region of the semiconductor layer thereof with an interlayer insulation film being interposed between the gate electrode of the switching element and the pixel-electrode-side source/drain region of the semiconductor layer thereof; and the interlayer insulation film that is interposed between the gate electrode of the switching element and the pixel-electrode-side source/drain region of the semiconductor layer thereof is formed as a multilayer film that is made up of one film layer that is the same layer as the gate insulation film and another film layer that is formed on the above-mentioned one film layer or another set of film layers that are formed on and over the above-mentioned one film layer.

4. The electro-optical device according to claim 1, wherein the gate electrode of the switching element is provided opposite to the pixel-electrode-side source/drain region of the semiconductor layer thereof with a protection film being interposed between the gate electrode of the switching element and the pixel-electrode-side source/drain region of the semiconductor layer thereof; and the protection film that is interposed between the gate electrode of the switching element and the pixel-electrode-side source/drain region of the semiconductor layer thereof functions as a protective stopper at the time when a layer or layers formed over the protection film is/are etched away, removed, or treated in other way for patterning.

5. The electro-optical device according to claim 1, wherein the channel region of the semiconductor layer of the switching element is formed substantially outside a cross region at which the data line and the scanning line intersect each other in a plan view; and at least a part of the channel region of the semiconductor layer thereof is formed inside a region that is covered by the data line in the plan view.

6. The electro-optical device according to claim 1, wherein the data-line-side source/drain region of the semiconductor layer of the switching element is formed outside a cross region at which the data line and the scanning line intersect each other in a plan view and inside a region that is covered by the data line in the plan view.

7. The electro-optical device according to claim 1, wherein the pixel-electrode-side source/drain region of the semiconductor layer of the switching element is formed outside the cross region and inside a region that is covered by the data line in a plan view.

8. The electro-optical device according to claim 1, wherein the gate electrode of the switching element is formed as a part of the scanning line; and the gate electrode of the switching element is made of the same film as the scanning line in such a manner that the gate electrode thereof and the scanning line constitute the same single pattern that is formed on the same layer.

9. An electronic apparatus that is provided with the electro-optical device according to claim 1.

10. The electro-optical device according to claim 1, wherein the gate electrode does not overlap the second junction region.

* * * * *